United States Patent
Hagiwara et al.

(10) Patent No.: US 12,439,835 B2
(45) Date of Patent: Oct. 7, 2025

(54) CONNECTION STRUCTURE FOR SUPERCONDUCTING LAYER, SUPERCONDUCTING WIRE, SUPERCONDUCTING COIL, SUPERCONDUCTING DEVICE, AND CONNECTION METHOD FOR SUPERCONDUCTING LAYER

(71) Applicants: KABUSHIKI KAISHA TOSHIBA, Tokyo (JP); TOSHIBA ENERGY SYSTEMS & SOLUTIONS CORPORATION, Kawasaki (JP)

(72) Inventors: Masaya Hagiwara, Yokohama Kanagawa (JP); Tomoko Eguchi, Yokohama Kanagawa (JP); Keiko Albessard, Yokohama Kanagawa (JP); Yasushi Hattori, Kawasaki Kanagawa (JP)

(73) Assignees: Kabushiki Kaisha Toshiba, Tokyo (JP); Toshiba Energy Systems & Solutions Corporation, Kawasaki (JP)

( * ) Notice: Subject to any disclaimer, the term of this patent is extended or adjusted under 35 U.S.C. 154(b) by 819 days.

(21) Appl. No.: 17/689,861

(22) Filed: Mar. 8, 2022

(65) Prior Publication Data
US 2022/0199887 A1 Jun. 23, 2022

Related U.S. Application Data

(63) Continuation of application No. PCT/JP2021/006370, filed on Feb. 19, 2021.

(30) Foreign Application Priority Data

Sep. 1, 2020 (JP) ................................. 2020-147013

(51) Int. Cl.
*H10N 60/85* (2023.01)
*H01F 6/06* (2006.01)
(Continued)

(52) U.S. Cl.
CPC ............. *H10N 60/858* (2023.02); *H01F 6/06* (2013.01); *H01R 4/68* (2013.01); *H10N 60/0352* (2023.02)

(58) Field of Classification Search
CPC ......................... H10N 60/858; H10N 60/0352
See application file for complete search history.

(56) References Cited

U.S. PATENT DOCUMENTS 4,874,430 A * 10/1989 Bornstein ................ H01B 1/02
419/21
5,929,001 A * 7/1999 Goretta .............. H10N 60/0828
505/492
(Continued)

FOREIGN PATENT DOCUMENTS

JP 5828299 B2 12/2015
JP 2016-110816 A 6/2016
(Continued)

OTHER PUBLICATIONS

K. Ohki et al., "Fabrication, microstructure and persistent current measurement of an intermediate grown superconducting (iGS) joint between REBCO-coated conductors," Supercond. Sci. Technol., vol. 30:115017, 7 pages (2017).

*Primary Examiner* — Paul A Wartalowicz
(74) *Attorney, Agent, or Firm* — Finnegan, Henderson, Farabow, Garrett & Dunner, LLP

(57) ABSTRACT

A connection structure for a superconducting layer according to an embodiment includes a first superconducting layer; a second superconducting layer; and a connection layer disposed between the first superconducting layer and the second superconducting layer, the connection layer includ- (Continued)

ing crystal grains containing a rare earth element (RE), barium (Ba), copper (Cu), and oxygen (O), the crystal grains having a grain size distribution including a bimodal distribution. The bimodal distribution includes a first distribution including a first peak and a second distribution including a second peak. A first grain size corresponding to the first peak is larger than a second grain size corresponding to the second peak. Among the crystal grains, crystal grains having a grain size corresponding to the first distribution include a crystal grain having a plate shape or a flat shape.

20 Claims, 20 Drawing Sheets

(51) Int. Cl.
  *H01R 4/68* (2006.01)
  *H10N 60/01* (2023.01)

(56) References Cited

U.S. PATENT DOCUMENTS

2014/0296078 A1* 10/2014 Oh .................. H02G 15/34
  505/410
2018/0025812 A1  1/2018 Ohki et al.

FOREIGN PATENT DOCUMENTS

| | | |
|---|---|---|
| JP | 6178779 B2 | 8/2017 |
| JP | 6675590 B2 | 4/2020 |
| WO | WO 2016/129469 A1 | 8/2016 |
| WO | WO 2018/211764 A1 | 11/2018 |
| WO | WO 2018/211766 A1 | 11/2018 |

\* cited by examiner

FIG.4
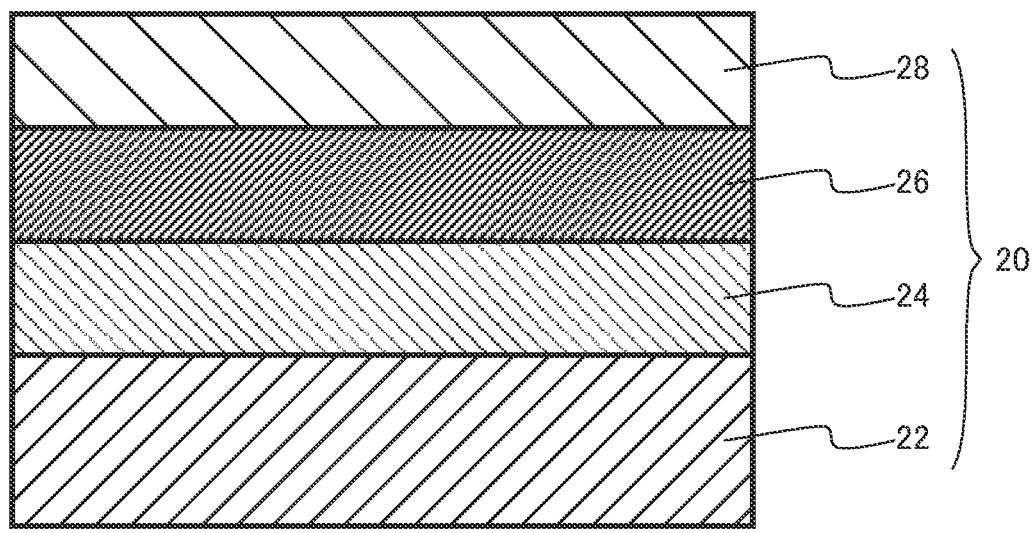
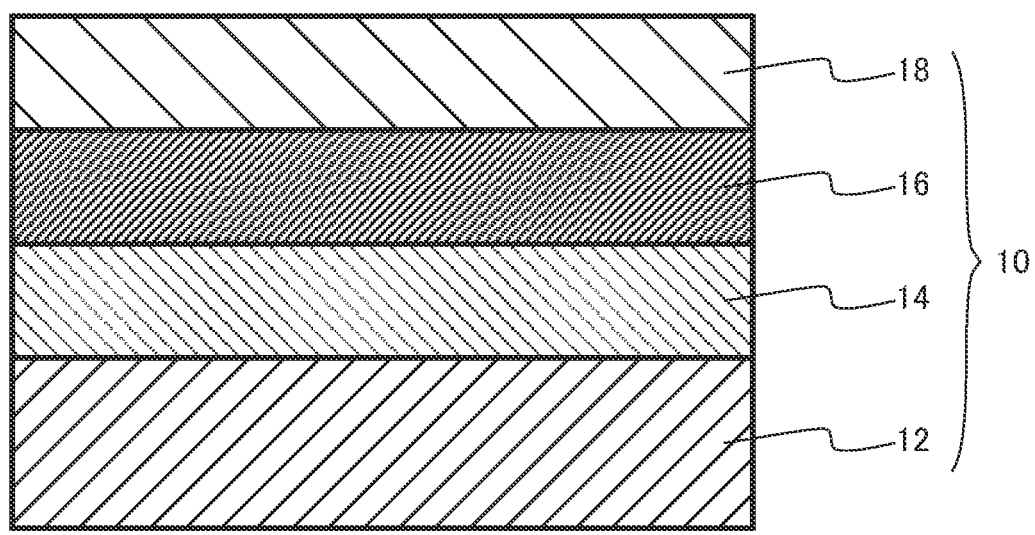

FIG.5
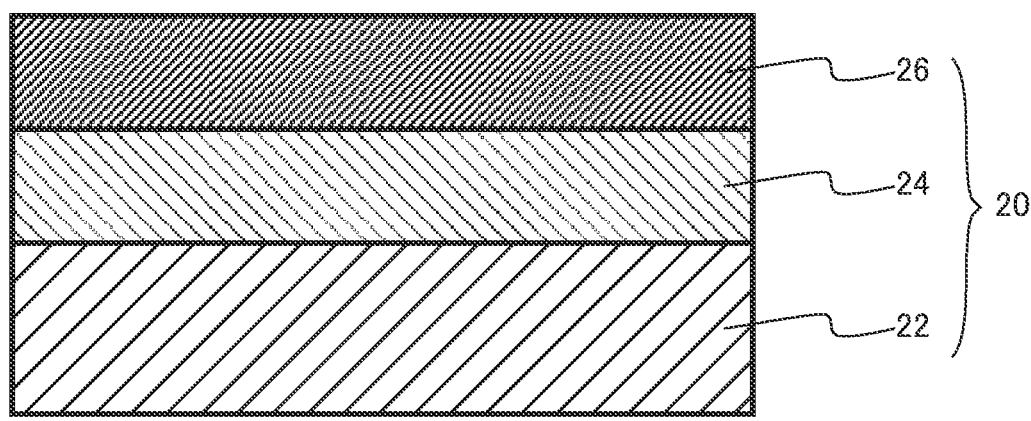
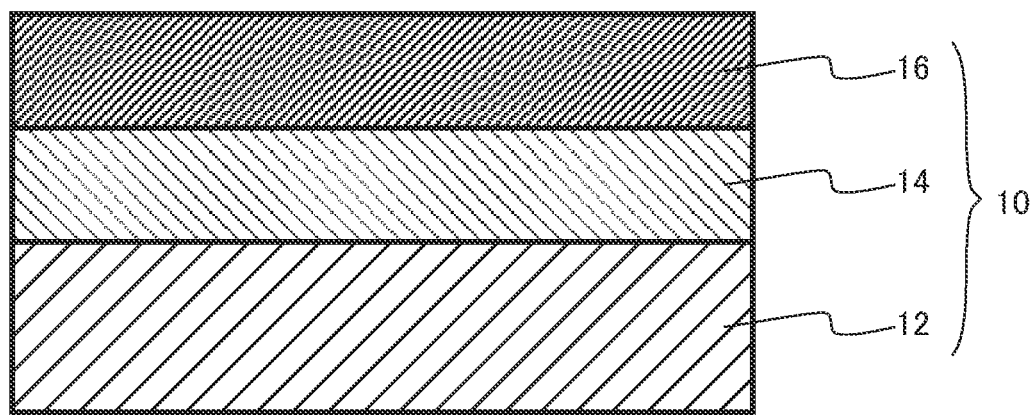

FIG.6
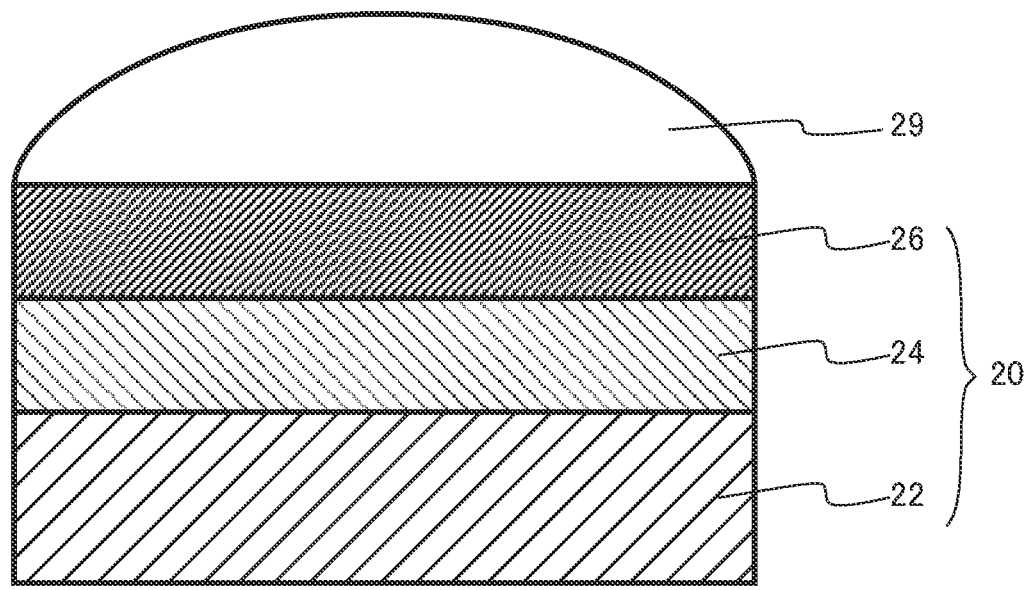
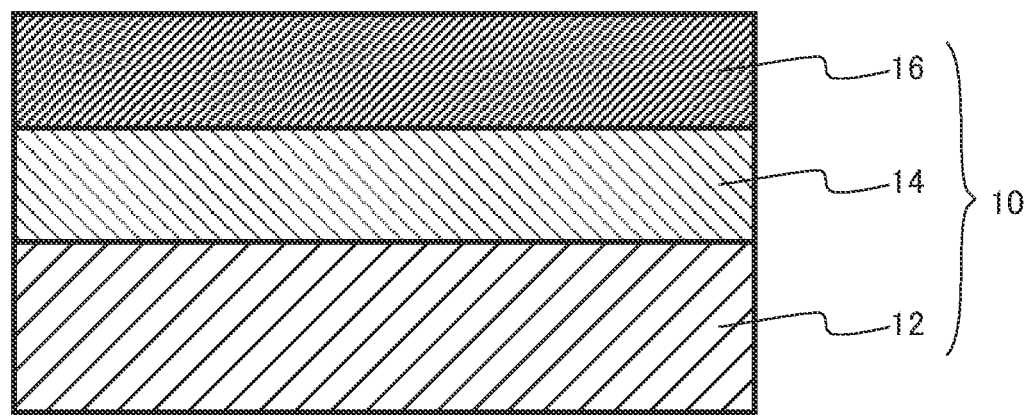

FIG.7
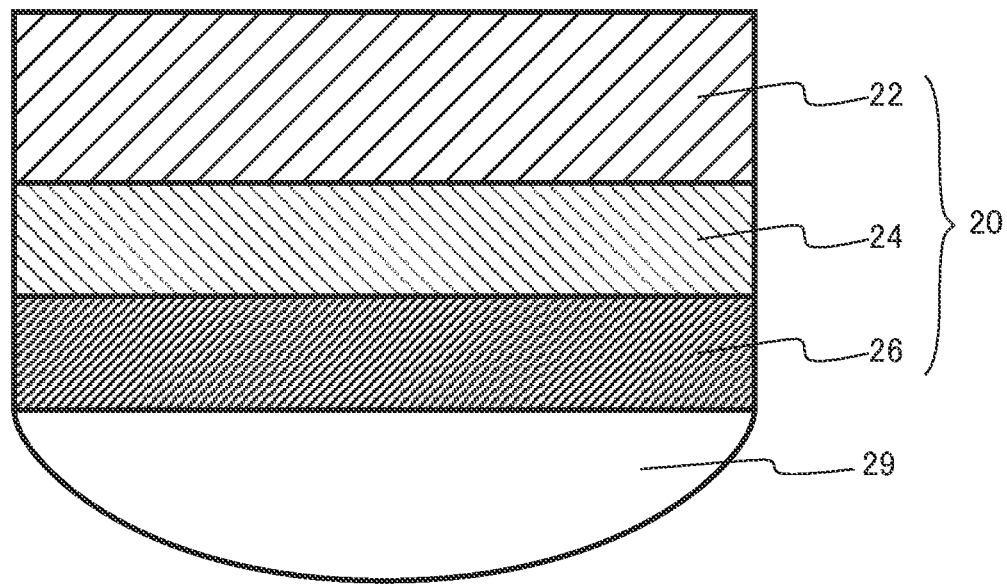
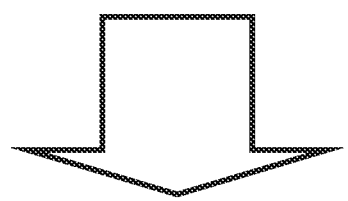
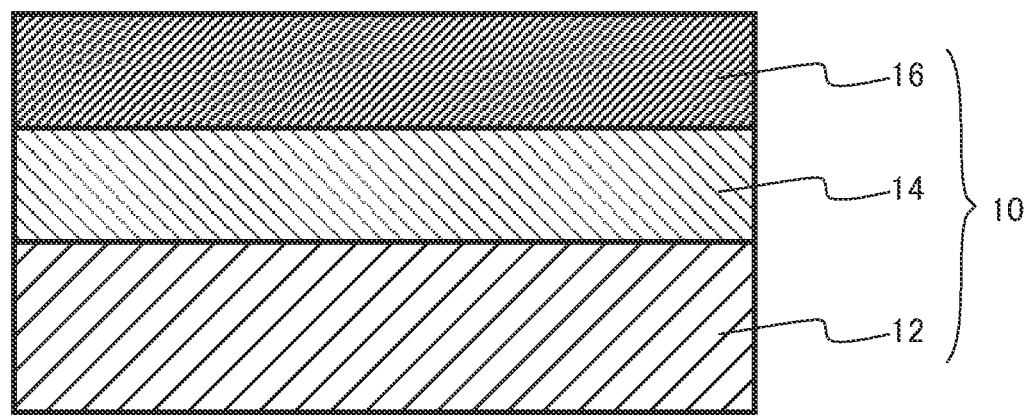

CONNECTION STRUCTURE FOR SUPERCONDUCTING LAYER, SUPERCONDUCTING WIRE, SUPERCONDUCTING COIL, SUPERCONDUCTING DEVICE, AND CONNECTION METHOD FOR SUPERCONDUCTING LAYER

CROSS-REFERENCE TO RELATED APPLICATION

This application is continuation application of, and claims the benefit of priority from the International Application PCT/JP2021/6370, filed Feb. 19, 2021, which claims the benefit of priority from Japanese Patent Application No. 2020-147013, filed on Sep. 1, 2020, the entire contents of all of which are incorporated herein by reference.

FIELD

Embodiments of the present invention described herein relate to a connection structure for a superconducting layer, a superconducting wire, a superconducting coil, a superconducting device, and a connection method for a superconducting layer.

BACKGROUND

In a nuclear magnetic resonance device (NMR) or a magnetic resonance imaging device (MRI), a superconducting coil is used to generate a strong magnetic field. The superconducting coil is formed by winding a superconducting wire around a winding frame.

To lengthen the superconducting wire, a plurality of superconducting wires may be connected, for example. For example, the ends of two superconducting wires may be connected using a connection structure. The connection structure for connecting the superconducting wires is required to have low electric resistance and high mechanical strength.

BRIEF DESCRIPTION OF THE DRAWINGS

FIG. 4 is an explanatory diagram of preparation of a first superconducting layer and a second superconducting layer in a connection method for a superconducting layer according to the first embodiment;

FIG. 5 is an explanatory diagram of removal of a first protective layer and a second protective layer in the connection method for a superconducting layer according to the first embodiment;

FIG. 6 is an explanatory diagram of application of slurry onto the second superconducting layer in the connection method for a superconducting layer according to the first embodiment;

FIG. 7 is an explanatory diagram of a state in which the first superconducting layer and the second superconducting layer are opposed to each other in the connection method for a superconducting layer according to the first embodiment;

DETAILED DESCRIPTION

A connection structure for a superconducting layer comprising:
  a first superconducting layer;
  a second superconducting layer; and.
  a connection layer disposed between the first superconducting layer and the second superconducting layer, the connection layer including crystal grains containing a rare earth element (RE), barium (Ba), copper (Cu), and oxygen (O), the crystal grains having a grain size distribution including a bimodal distribution. The bimodal distribution includes a first distribution including a first peak and a second distribution including a second peak. A first grain size corresponding to the first peak is larger than a second grain size corresponding to the second peak. And, among the crystal grains, crystal grains having a grain size corresponding to the first distribution include a crystal grain having a plate shape or a flat shape.

Hereinbelow, embodiments of the present disclosure will be described with reference to the drawings. Note that, in the following description, similar or identical members are labeled with the same reference signs, and description of the member or the like described once may be omitted as appropriate.

In the present specification, a "grain size" of a grain or the like is a major axis of the grain unless otherwise specified. The major axis of a grain is a maximum length among lengths between any two points on the outer circumference of the grain. A minor axis of a grain is a minimum length among lengths between any two points on the outer circumference of the grain. The major axis and the minor axis of a grain can be derived by an image analysis of a scanning electron microscope image (SEM image), for example.

Detection of elements contained in grains or the like and measurement of atomic concentration of the elements can be performed by means of energy dispersive X-ray spectroscopy (EDX) or wavelength dispersive X-ray analysis (WDX), for example. Also, substances contained in the grains or the like can be identified by means of powder X-ray diffractometry, for example.

First Embodiment

A connection structure for a superconducting layer according to a first embodiment includes a first superconducting layer, a second superconducting layer, and a connection layer provided between the first superconducting layer and the second superconducting layer, the connection layer including a crystal grain containing a rare earth element (RE), barium (Ba), copper (Cu), and oxygen (O), the crystal grain having a grain size distribution including a bimodal distribution. Also, the connection layer includes at least any one grain selected from the group including a first grain containing a rare earth element (RE) and oxygen (O), a second grain containing barium (Ba), carbon (C), and oxygen (O), a third grain containing copper (Cu) and oxygen (O), and a fourth grain containing barium (Ba), copper (Cu), and oxygen (O).

Figure 1:
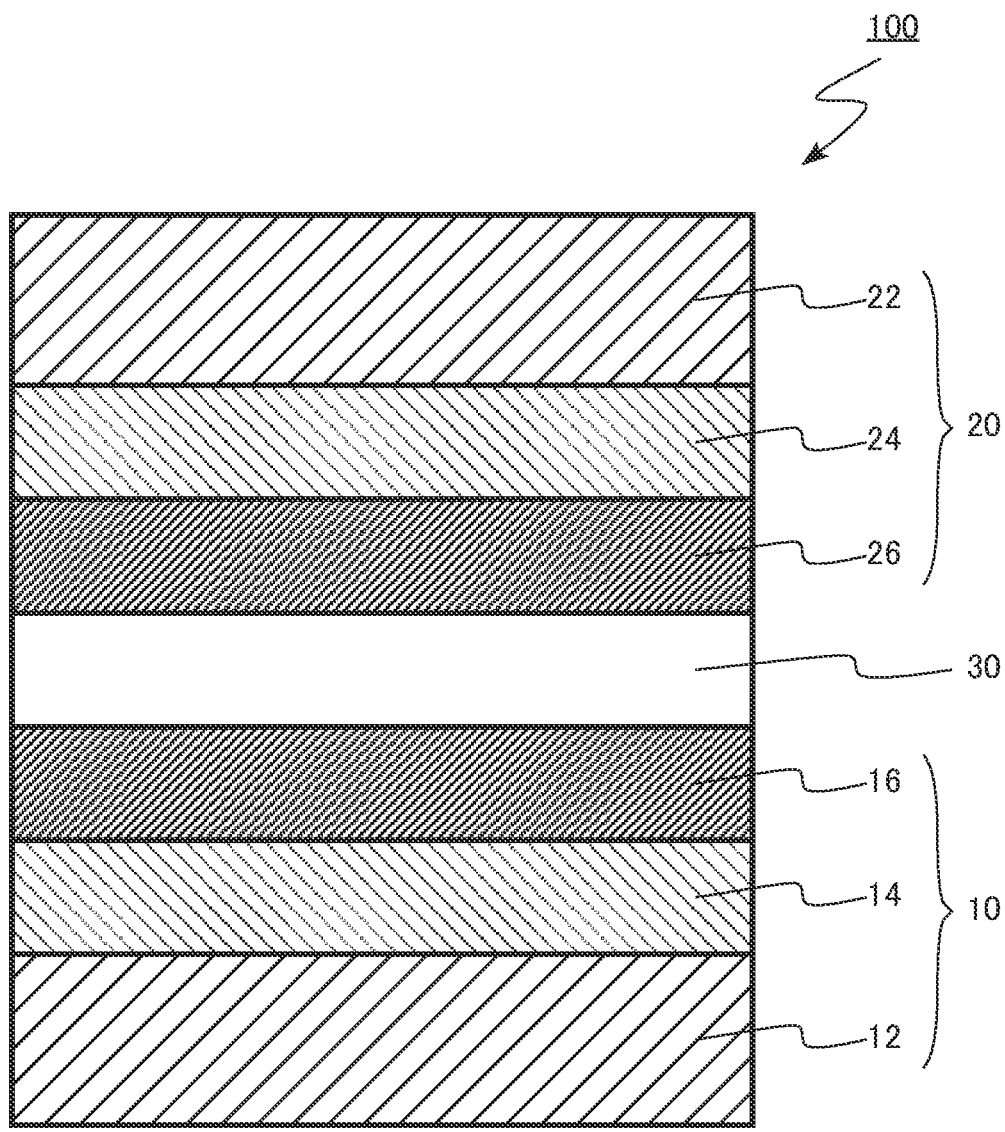
FIG. 1 is a schematic cross-sectional view of a connection structure for a superconducting layer according to a first embodiment.

FIG. 1 is a schematic cross-sectional view of a connection structure for a superconducting layer according to the first embodiment. A connection structure 100 according to the first embodiment is a structure physically and electrically connecting two superconducting layers. The connection structure 100 is used to connect two superconducting wires and lengthen a superconducting wire, for example.

The connection structure 100 includes a first superconducting member 10, a second superconducting member 20, and a connection layer 30. The connection structure 100 is a structure in which the first superconducting member 10 and the second superconducting member 20 are connected by the connection layer 30. The connection layer 30 is provided between the first superconducting member 10 and the second superconducting member 20.

The first superconducting member 10 includes a first substrate 12, a first intermediate layer 14, and a first superconducting layer 16. The second superconducting member 20 includes a second substrate 22, a second intermediate layer 24, and a second superconducting layer 26.

The first substrate 12 is metal, for example. The first substrate 12 is a nickel alloy or a copper alloy, for example. The first substrate 12 is a nickel-tungsten alloy, for example.

The first superconducting layer 16 is an oxide superconducting layer, for example. The first superconducting layer 16 contains a rare earth element (RE), barium (Ba), copper (Cu), and oxygen (O), for example. The first superconducting layer 16 contains at least one rare earth element (RE) selected from the group including yttrium (Y), lanthanum (La), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu), for example.

The first superconducting layer 16 has a chemical composition represented as (RE) $Ba_2Cu_3O_\delta$ (RE is a rare earth element, $6 \leq \delta \leq 7$), for example. The first superconducting layer 16 has a chemical composition represented as $GdBa_2Cu_3O_\delta$ ($6 \leq \delta \leq 7$), $YBa_2Cu_3O_\delta$ ($6 \leq \delta \leq 7$), or $EuBa_2Cu_3O_\delta$ ($6 \leq \delta \leq 7$), for example.

The first superconducting layer 16 contains a single crystal having a perovskite structure, for example.

The first superconducting layer 16 is formed on the first intermediate layer 14 by means of a metal organic deposition method (MOD method), a pulsed laser deposition method (PLD method), or a metal organic chemical vapor deposition method (MOCVD Method), for example.

The first intermediate layer 14 is provided between the first substrate 12 and the first superconducting layer 16. The first intermediate layer 14 is in contact with the first superconducting layer 16, for example. The first intermediate layer 14 has a function of improving crystal orientation of the first superconducting layer 16 formed on the first intermediate layer 14.

The first intermediate layer 14 contains rare earth oxide, for example. The first intermediate layer 14 includes a laminated structure of a plurality of films, for example. The first intermediate layer 14 has a structure in which yttrium oxide ($Y_2O_3$), yttria-stabilized zirconia (YSZ), and cerium oxide ($CeO_2$) are laminated from a side provided with the first substrate 12, for example.

The second substrate 22 is metal, for example. The second substrate 22 is a nickel alloy or a copper alloy, for example. The second substrate 22 is a nickel-tungsten alloy, for example.

The second superconducting layer 26 is an oxide superconducting layer, for example. The second superconducting layer 26 contains a rare earth element (RE), barium (Ba), copper (Cu), and oxygen (O), for example. The second superconducting layer 26 contains at least one rare earth element (RE) selected from the group including yttrium (Y), lanthanum (La), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu), for example.

The second superconducting layer 26 has a chemical composition represented as (RE) $Ba_2Cu_3O_\delta$ (RE is a rare earth element, $6 \leq \delta \leq 7$), for example. The second superconducting layer 26 has a chemical composition represented as $GdBa_2Cu_3O_\delta$ ($6 \leq \delta \leq 7$), $YBa_2Cu_3O_\delta$ ($6 \leq \delta \leq 7$), or $EuBa_2Cu_3O_\delta$ ($6 \leq \delta \leq 7$), for example.

The second superconducting layer 26 contains a single crystal having a perovskite structure, for example.

The second superconducting layer 26 is formed on the second intermediate layer 24 by means of the MOD method, the PLD method, or the MOCVD method, for example.

The second intermediate layer 24 is provided between the second substrate 22 and the second superconducting layer 26. The second intermediate layer 24 is in contact with the second superconducting layer 26, for example. The second intermediate layer 24 has a function of improving crystal orientation of the second superconducting layer 26 formed on the second intermediate layer 24.

The second intermediate layer 24 contains rare earth oxide, for example. The second intermediate layer 24 includes a laminated structure of a plurality of films, for example. The second intermediate layer 24 has a structure in which yttrium oxide ($Y_2O_3$), yttria-stabilized zirconia (YSZ), and cerium oxide ($CeO_2$) are laminated from a side provided with the second substrate 22, for example.

The connection layer 30 is provided between the first superconducting layer 16 and the second superconducting layer 26. The connection layer 30 is in contact with the first superconducting layer 16. The connection layer 30 is in contact with the second superconducting layer 26.

The connection layer 30 is an oxide superconducting layer. The connection layer 30 contains a rare earth element (RE), barium (Da), copper (Cu), and oxygen (O). The connection layer 30 contains at least one rare earth element (RE) selected from the group including yttrium (Y), lanthanum (La), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu), for example.

Figure 2:
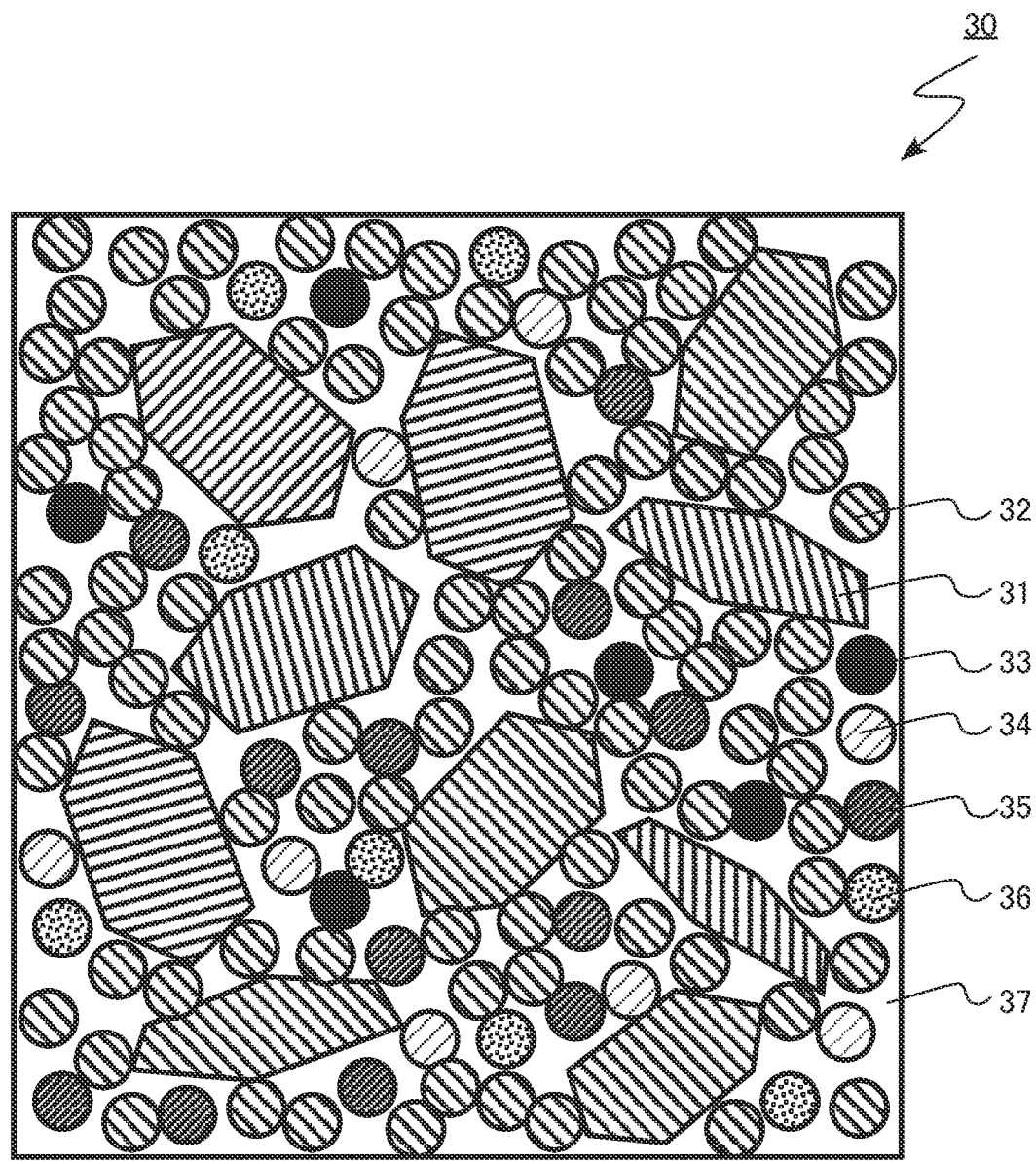
FIG. 2 is an enlarged schematic cross-sectional view of a part of a connection layer according to the first embodiment.

FIG. 2 is an enlarged schematic cross-sectional view of a part of the connection layer according to the first embodiment.

The connection layer 30 includes a first crystal grain 31, a second crystal grain 32, a first grain 33, a second grain 34, a third grain 35, a fourth grain 36, and a void 37. The connection layer 30 is formed by sintering the first crystal grain 31, the second crystal grain 32, the first grain 33, the second grain 34, the third grain 35, and the fourth grain 36.

The first crystal grain 31 and the second crystal grain 32 are examples of a crystal grain.

The connection layer 30 is porous. The void 37 exists between the grains included in the connection layer 30.

The first crystal grain 31 contains a rare earth element (RE), barium (Ba), copper (Cu), and oxygen (O). The first crystal grain 31 is rare earth oxide. The first crystal grain 31 is a single crystal or a polycrystal having a perovskite structure, for example.

The first crystal grain 31 has a chemical composition represented as (RE) $Ba_2Cu_3O_\delta$ (RE is a rare earth element, $6 \leq \delta \leq 7$), for example. The first crystal grain 31 has a chemical composition represented as $GdBa_2Cu_3O_\delta$ ($6 \leq \delta \leq 7$), $YBa_2Cu_3O_\delta$ ($6 \leq \delta \leq 7$), or $EuBa_2Cu_3O_\delta$ ($6 \leq \delta \leq 7$), for example.

The first crystal grain 31 is formed in a plate shape or flat shape, for example. The flat shape means that the aspect ratio of the grain is equal to or more than 2. The aspect ratio of the grain is the ratio of the major axis of the grain to the minor axis of the grain (major axis/minor axis).

A median of the grain size of the first crystal grain 31 is equal to or more than 100 nm and equal to or less than 10 μm, for example. A more preferable range is equal to or more than 1 μm and equal to or less than 5 μm, for example.

The first crystal grain 31 is a superconductor.

The second crystal grain 32 contains a rare earth element (RE), barium (Ba), copper (Cu), and oxygen (O). The second crystal grain 32 is rare earth oxide. The second crystal grain 32 is a single crystal or a polycrystal having a perovskite structure, for example. The second crystal grain 32 has a chemical composition represented as (RE) $Ba_2Cu_3O_\delta$ (RE is a rare earth element, $6 \leq \delta \leq 7$), for example.

The second crystal grain 32 contains an equal rare earth element to that of the first crystal grain 31, for example. The chemical composition of the second crystal grain 32 is equal to the chemical composition of the first crystal grain 31, for example. A case in which the chemical composition of the second crystal grain 32 and the chemical composition of the first crystal grain 31 are equal is preferable since the connectivity between the first crystal grain 31 and the second crystal grain 32 is improved.

The second crystal grain 32 may contain a different rare earth element from that of the first crystal grain 31, for example. The chemical composition of the second crystal grain 32 may be different from the chemical composition of the first crystal grain 31, for example.

The second crystal grain 32 is formed in a spherical or irregular shape, for example. The aspect ratio of the second crystal grain 32 is less than 2, for example. A median of the grain size of the second crystal grain 32 is lower than the median of the grain size of the first crystal grain 31. The median of the grain size of the second crystal grain 32 is equal to or more than 10 nm and equal to or less than 1 μm, for example.

The second crystal grain 32 is a superconductor, for example.

The crystallinity of the first crystal grain 31 is better than the crystallinity of the second crystal grain 32, for example. Good crystallinity means that the defect density in the crystal is low, for example. The good crystallinity also means that the grain size of the crystal constituting the polycrystalline crystal grain is large.

Figure 3:
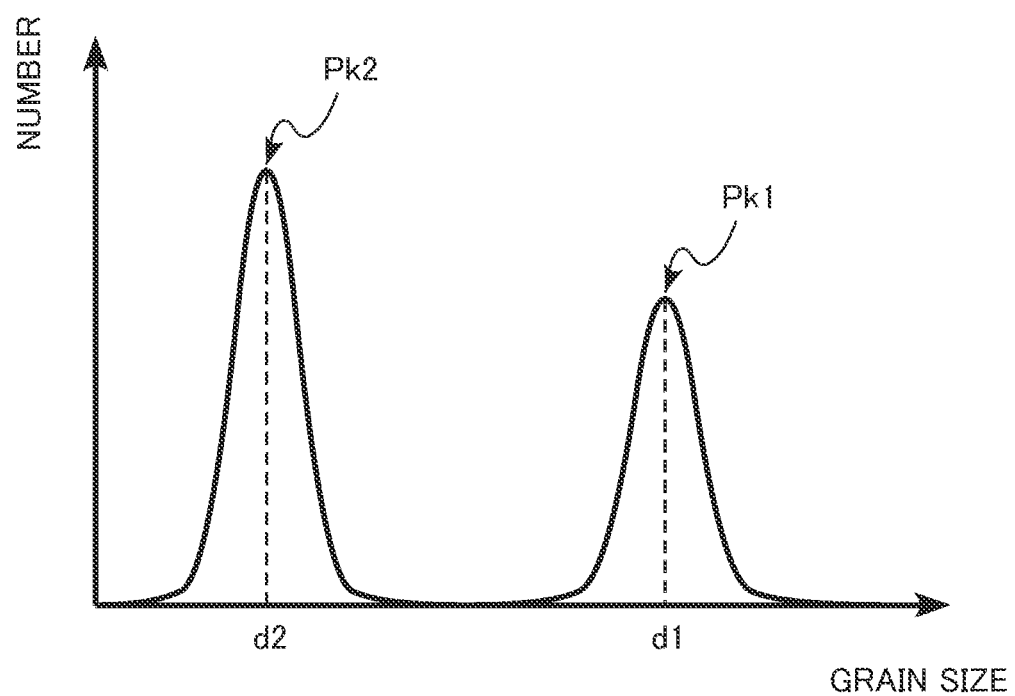
FIG. 3 is a diagram illustrating a grain size distribution of crystal grains included in the connection layer according to the first embodiment.

FIG. 3 is a diagram illustrating a grain size distribution of the crystal grains included in the connection layer according to the first embodiment. FIG. 3 illustrates the grain size distribution of the crystal grains of both the first crystal grains 31 and the second crystal grains 32 included in the connection layer 30.

As illustrated in FIG. 3, the grain size distribution of the crystal grains included in the connection layer 30 includes a bimodal distribution. The bimodal distribution includes a first distribution including a first peak (Pk1 in FIG. 3) and a second distribution including a second peak (Pk2 in FIG. 3).

Note that the grain size distribution of the crystal grains included in the connection layer 30 may be a multimodal distribution including three or more peaks.

The grain size of the crystal grains corresponding to the first peak Pk1 is a first grain size (d1 in FIG. 3). The grain size of the crystal grains corresponding to the second peak Pk2 is a second grain size (d2 in FIG. 3).

The first grain size d1 is larger than, the second grain size d2. The first grain size d1 is equal to or more than 10 times and equal to or less than 1000 times the second grain size d2, for example.

The first grain size d1 is equal to or more than 100 nm and equal to or less than 10 μm, for example. The second grain size d2 is equal to or more than 10 nm and equal to or less than 1 μm, for example.

The first distribution mainly includes the first crystal grains 31. The second distribution mainly includes the second crystal grains 32.

The crystal grains having the grain size corresponding to the first distribution include crystal grains formed in plate shape or flat shapes, for example. For example, among the crystal grains having the grain size corresponding to the first distribution, the ratio of the crystal grains formed in the plate shape or flat shapes is higher than the ratio of the crystal grains formed in the other shapes in terms of number.

The crystal grains having the grain size corresponding to the second distribution include crystal grains formed in spherical or irregular shapes, for example. For example, among the crystal grains having the grain size corresponding to the second distribution, the ratio of the crystal grains formed in the spherical or irregular shapes is higher than the ratio of the crystal grains formed in the other shapes in terms of number.

Among the crystal grains of both the first crystal grains 31 and the second crystal grains 32, the ratio of crystal grains having a grain size of equal to or more than 100 nm and equal to or less than 10 μm is equal to or more than 1% and equal to or less than 50% in terms of number, for example.

The first grain 33 contains a rare earth element (RE) and oxygen (O). The first grain 33 and the second crystal grain 32 contain an equal rare earth element (RE). The first grain 33 has a chemical composition represented as $RE_2O_3$ (RE is a rare earth element), for example.

The first grain 33 is crystalline, for example. The first grain 33 is formed in a spherical or irregular shape, for example. A median of the grain size of the first grain 33 is lower than the median of the grain size of the first crystal grain 31. The median of the grain size of the first grain 33 is equal to or more than 1 nm and equal to or less than 100 nm, for example.

The second grain 34 contains barium (Ba), carbon. (C), and oxygen (O). The second grain 34 has a chemical composition represented as $BaCO_3$, for example.

The second grain 34 is crystalline, for example. The second grain 34 is formed in a spherical or irregular shape, for example. A median of the grain size of the second grain 34 is lower than the median of the grain size of the first crystal grain 31. The median of the grain size of the second grain 34 is equal to or more than 1 nm and equal to or less than 1 µm, for example.

The third grain 35 contains copper (Cu) and oxygen (O). The third grain 35 has a chemical composition represented as CuO, for example.

The third grain 35 is crystalline, for example. The third grain 35 is formed in a spherical or irregular shape, for example. A median of the grain size of the third grain 35 is lower than the median of the grain size of the first crystal grain 31. The median of the grain size of the third grain 35 is equal to or more than 1 nm and equal to or less than 100 nm, for example.

The fourth grain 36 contains barium (Ba), copper (Cu), and oxygen (O). The fourth grain 36 has a chemical composition represented as $BaCu_xO_y$ ($0 \leq x \leq 2$, $0 < y \leq 4$), for example.

The fourth grain 36 is crystalline, for example. The fourth grain 36 is formed in a spherical or irregular shape, for example. A median of the grain size of the fourth grain 36 is lower than the median of the grain size of the first crystal grain 31. The median of the grain size of the fourth grain 36 is equal to or more than 1 nm and equal to or less than 1 µm, for example.

The chemical compositions of the first grain 33, the second grain 34, the third grain 35, and the fourth grain 36 are different. Also, the chemical compositions of the first grain 33, the second grain 34, the third grain 35, and the fourth grain 36 are different from any of the chemical compositions of the first crystal grain 31 and the second crystal grain 32.

Among the first crystal grains 31, the second crystal grains 32, the first grains 33, the second grains 34, the third grains 35, and the fourth grains 36, the ratio of the first grains 33, the second grains 34, the third grains 35, and the fourth grains 36 is equal to or more than 0.1% and equal to or less than 10% in terms of number, for example.

Note that a configuration in which the connection layer 30 includes only one kind of grain selected from the first grain 33, the second grain 34, the third grain 35, and the fourth grain 36 is available. Also, a configuration in which the connection layer 30 includes only two kinds of grain selected from the first grain 33, the second grain 34, the third grain 35, and the fourth grain 36 is available. Further, a configuration in which the connection layer 30 includes only three kinds of grain selected from the first grain 33, the second grain 34, the third grain 35, and the fourth grain 36 is available.

The connection layer 30 contains sodium (Na), for example. The atomic concentration of sodium (Na) contained in the connection layer 30 is equal to or more than 0.01% and equal to or less than 1%, for example.

The atomic concentration of sodium (Na) contained in the connection layer 30 can be derived by means of the EDX or the WDX, for example. The atomic concentration of sodium (Na) is an atomic concentration whose denominator is the amount of all atoms measured by means of the WDX or the EDX.

Next, an example of a connection method for a superconducting layer according to the first embodiment will be described. FIGS. 4, 5, 6, 7, 8, and 9 are explanatory views of a connection method for a superconducting layer according to the first embodiment.

In the connection method for a superconducting layer according to the first embodiment, a first superconducting layer and a second superconducting layer are prepared, slurry is prepared including a crystal grain containing a rare earth element (RE), barium (Ba), copper (Cu), and oxygen (O), a first grain containing a rare earth element (RE) and oxygen (O), a second grain containing barium (Ba), carbon (C), and oxygen (O), and a third grain containing copper (Cu) and oxygen (O), the slurry is applied onto the second superconducting layer, the first superconducting layer and the second superconducting layer are superposed with the slurry interposed between the first superconducting layer and the second superconducting layer, a first heat treatment is performed at a first temperature, and a second heat treatment is performed at a second temperature in an atmosphere having equal or higher oxygen partial pressure to or than that in the first heat treatment.

First, the first superconducting layer 16 and the second superconducting layer 26 are prepared. The first superconducting member 10 and the second superconducting member 20 are prepared (FIG. 4).

The first superconducting member 10 includes the first substrate 12, the first intermediate layer 14, the first superconducting layer 16, and a first protective layer 18. The first protective layer 18 is provided on the first superconducting layer 16. The first protective layer 18 has a function of protecting the first superconducting layer 16.

The first protective layer 18 is metal, for example. The first protective layer 18 contains silver (Ag) or copper (Cu), for example.

The second superconducting member 20 includes the second substrate 22, the second intermediate layer 24, the second superconducting layer 26, and a second protective layer 28. The second protective layer 28 is provided on the second superconducting layer 26. The second protective layer 28 has a function of protecting the second superconducting layer 26.

The second protective layer 28 is metal, for example. The second protective layer 28 contains silver (Ag) or copper (Cu), for example.

Subsequently, the first protective layer 18 on the first superconducting layer 16 is removed. Subsequently, the second protective layer 28 on the second superconducting layer 26 is removed (FIG. 5). The first protective layer 18 and the second protective layer 28 are removed by means of a wet etching method, for example.

Subsequently, slurry 29 is prepared. The slurry 29 includes the first crystal grain 31, the first grain 33, the second grain 34, and the third grain 35.

The first crystal grain 31 contains a rare earth element (RE), barium (Ba), copper (Cu), and oxygen (O). The first crystal grain 31 is rare earth oxide. The first crystal grain 31 is a single crystal or a polycrystal having a perovskite structure, for example.

The first crystal grain 31 has a chemical composition represented as (RE) $Ba_2Cu_3O_\delta$ (RE is a rare earth element, $6 \leq \delta \leq 7$), for example. The first crystal grain 31 has a chemical composition represented as $GdBa_2Cu_3O_\delta$ ($6 \leq \delta \leq 7$), $YBa_2Cu_3O_\delta$ ($6 \leq \delta \leq 7$), or $EuBa_2Cu_3O_\delta$ ($6 \leq \delta \leq 7$), for example.

The first crystal grain 31 is formed in a plate shape or flat shape, for example. A median of the grain size of the first crystal grain 31 is equal to or more than 100 nm and equal to or less than 10 μm, for example.

The first crystal grain 31 is formed by pulverizing a superconductor of rare earth oxide, for example. The superconductor of rare earth oxide is formed by firing a powder raw material, for example. For example, the superconductor of rare earth oxide is formed by means of the MOD method, the PLD method, or the MOCVD method. The first crystal grain 31 formed by pulverizing the superconductor of rare earth oxide is formed in a plate shape or flat shape.

The first grain 33 contains a rare earth element (RE) and oxygen (O). The first grain 33 has a chemical composition represented as $RE_2O_3$ (RE is a rare earth element), for example.

The first grain 33 is crystalline, for example. The first grain 33 is formed in a spherical or irregular shape, for example. A median of the grain size of the first grain 33 is lower than the median of the grain size of the first crystal grain 31. The median of the grain size of the first grain 33 is equal to or more than 1 nm and equal to or less than 100 nm, for example.

The second grain 34 contains barium (Ba), carbon (C), and oxygen (O). The second grain 34 has a chemical composition represented as $BaCO_3$, for example, The second grain 34 is crystalline, for example. The second grain 34 is formed in a spherical or irregular shape, for example. A median of the grain size of the second grain 34 is lower than the median of the grain size of the first crystal grain 31. The median of the grain size of the second grain 34 is equal to or more than 1 nm and equal to or less than 1 μm, for example.

The third grain 35 contains copper (Cu) and oxygen (O). The third grain 35 has a chemical composition represented as CuO, for example.

The third grain 35 is crystalline, for example. The third grain 35 is formed in a spherical or irregular shape, for example. A median of the grain size of the third grain 35 is lower than the median of the grain size of the first crystal grain 31. The median of the grain size of the third grain 35 is equal to or more than 1 nm and equal to or less than 100 nm, for example.

The slurry 29 includes a sintering aid and a thickener, for example. The sintering aid is sodium alginate, for example.

Subsequently, the slurry 29 is applied onto the second superconducting layer 26 (FIG. 6).

Figure 8:
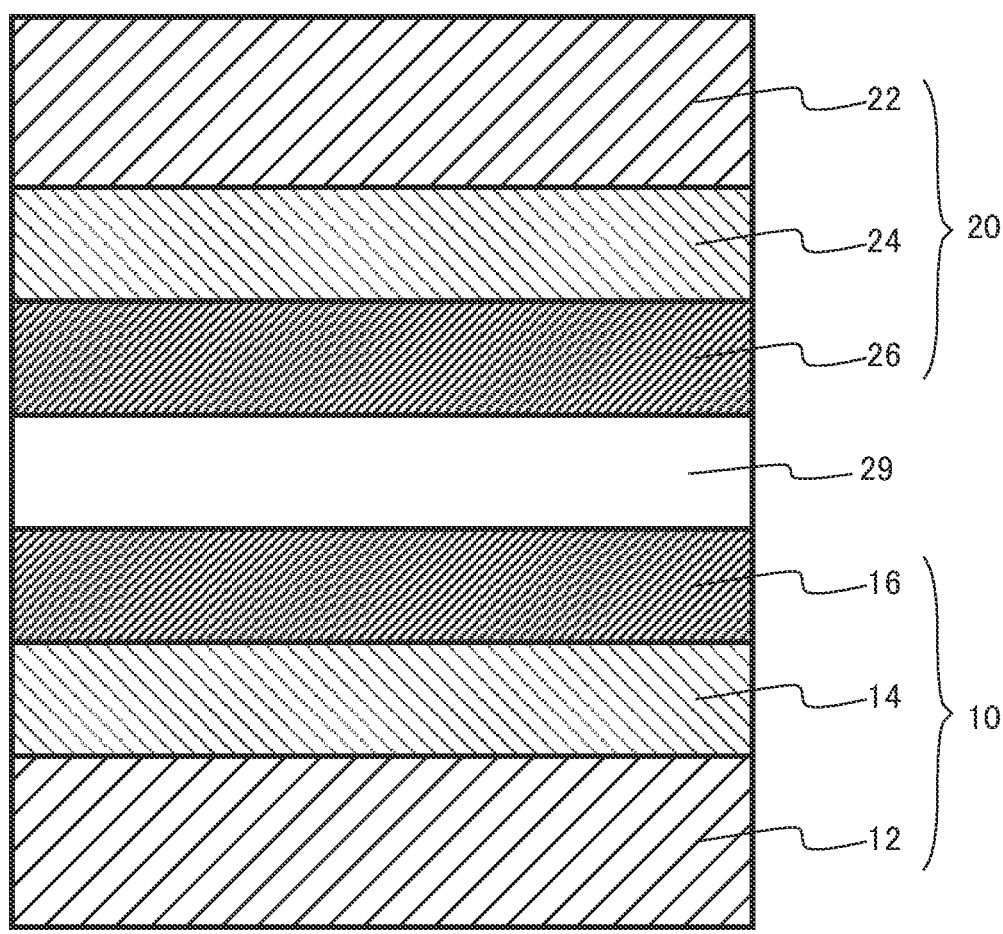
FIG. 8 is an explanatory diagram of a state in which the first superconducting layer and the second superconducting layer are superposed in the connection method for a superconducting layer according to the first embodiment.

Subsequently, for example, the second superconducting layer 26 is inverted, and the first superconducting layer 16 and the second superconducting layer 26 are opposed to each other with the slurry 29 interposed between the first superconducting layer 16 and the second superconducting layer 26 (FIG. 7). The first superconducting layer 16 and the second superconducting layer 26 are then superposed (FIG. 8).

Figure 9:
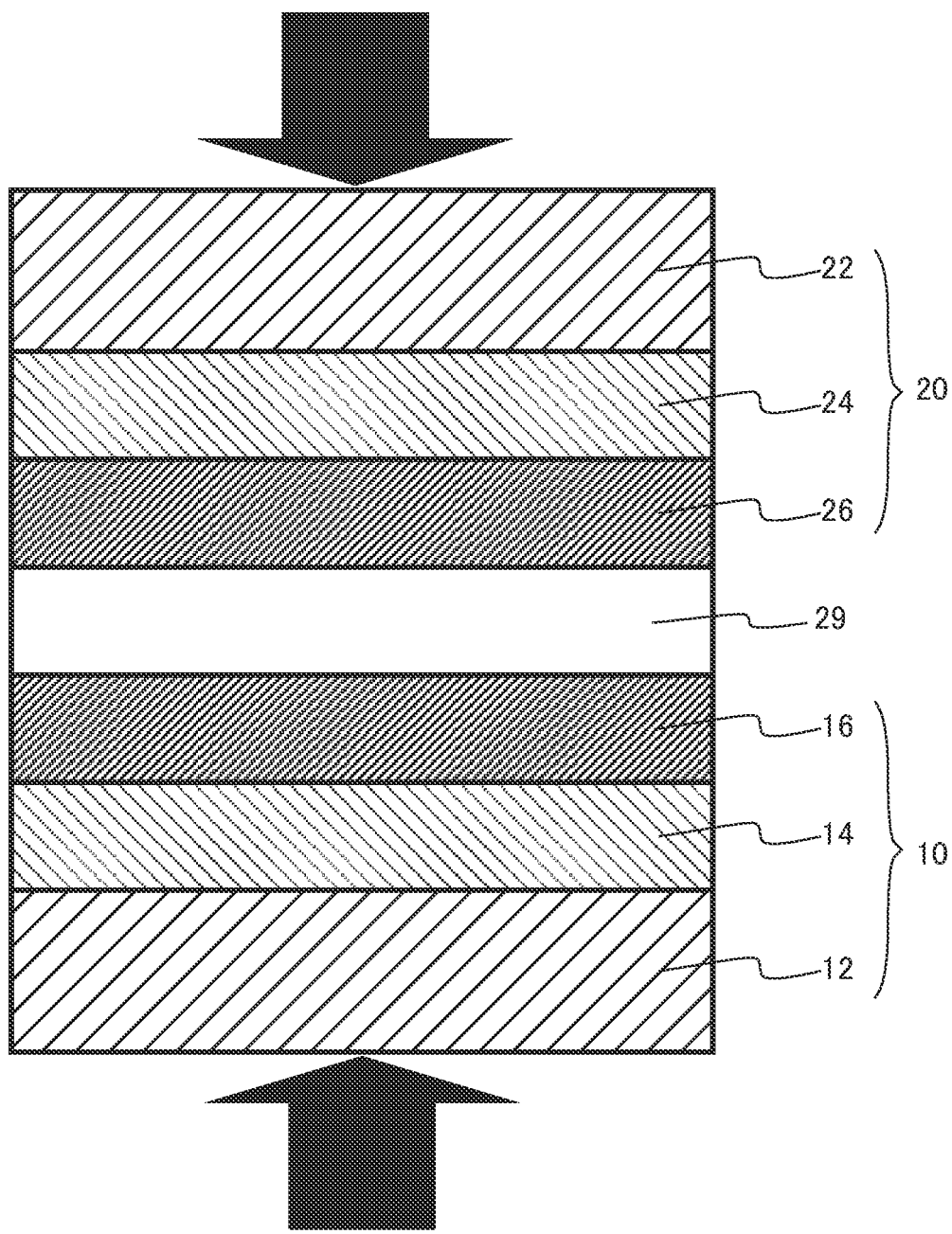
FIG. 9 is an explanatory diagram of a state in which the first superconducting layer and the second superconducting layer are pressurized in the connection method for a superconducting layer according to the first embodiment.

Subsequently, the first superconducting layer 16 and the second superconducting layer 26 superposed are pressurized in a direction from the second superconducting layer 26 to the first superconducting layer 16 (FIG. 9). For example, pressurization is performed by mounting a weight on the superposed portion. For example, pressurization is performed with use of a press machine. For example, pressurization can be performed by producing a jig for pressurization and inserting the superposed portion into the jig. In a case in which the jig is used, the jig may be removed after the connection, on the jig may be left attached. It is preferable to remove the jig since removing the jig makes it easier to wind a coil.

Subsequently, a first heat treatment is performed at a first temperature. The first heat treatment is performed in a state in which the first superconducting layer 16 and the second superconducting layer 26 are pressurized.

The first temperature is equal to or higher than 500° C. and equal to or lower than 850° C., for example. For example, the first temperature is preferably equal to or higher than 600° C. and equal to or lower than 800° C. The first heat treatment is performed at atmospheric pressure, for example. The first heat treatment is performed in an air atmosphere, an Ar atmosphere, a nitrogen atmosphere, an oxygen atmosphere, a mixed atmosphere of Ar and oxygen, or a mixed atmosphere of nitrogen and oxygen, for example.

Due to the first heat treatment, the first grain 33, the second grain 34, and the third grain 35 react to form the second crystal grain 32 serving as a superconductor. The first grain 33, the second grain 34, and the third grain 35 are raw materials for the second crystal grain 32 serving as a superconductor.

The second crystal grain 32 contains a rare earth element (RE), barium (Ba), copper (Cu), and oxygen (O). The second crystal grain 32 is rare earth oxide. The second crystal grain 32 is a single crystal or a polycrystal having a perovskite structure, for example. The second crystal grain 32 has a chemical composition represented as $(RE)Ba_2Cu_3O_\delta$ (RE is a rare earth element, $6 \leq \delta \leq 7$), for example.

The second crystal grain 32 is formed in a spherical or irregular shape, for example. A median of the grain size of the second crystal grain 32 is lower than the median of the grain size of the first crystal grain 31. The median of the grain size of the second crystal grain 32 is equal to or more than 10 nm and equal to or less than 1 μm, for example.

Meanwhile, the first grain 33, the second grain 34, and the third grain 35 that have not contributed to formation of the second crystal grain 32 remain in the connection layer 30.

Due to the first heat treatment, the second grain 34 and the third grain 35 react to form the fourth grain 36.

The fourth grain 36 contains barium (Ba), copper (Cu), and oxygen (O). The fourth grain 36 has a chemical composition represented as $BaCu_xO_y$ ($0 \leq x \leq 2$, $0 < y \leq 4$), for example.

The fourth grain 36 is crystalline, for example. The fourth grain 36 is formed in a spherical or irregular shape, for example. A median of the grain size of the fourth grain 36 is lower than the median of the grain size of the first crystal grain 31. The median of the grain size of the fourth grain 36 is equal to or more than 1 nm and equal to or less than 1 μm, for example.

Due to the first heat treatment, the first crystal grain 31, the second crystal grain 32, the first grain 33, the second grain 34, the third grain 35, and the fourth grain 36 are sintered.

Subsequently, a second heat treatment is performed at a second temperature. The second heat treatment is performed in an atmosphere containing oxygen. The second heat treatment is performed in an atmosphere having equal or higher oxygen partial pressure to or than that in the first heat treatment. The second heat treatment is oxygen annealing.

The second temperature is lower than the first temperature, for example. The second temperature is equal to or higher than 400° C. and equal to or lower than 600° C., for example. The second heat treatment may be performed by lowering the temperature to a lower temperature than the second temperature after the first heat treatment and raising the temperature to the second temperature. Also, the second heat treatment may be performed by continuously lowering the temperature to the second temperature after the first heat treatment.

The second heat treatment is performed at atmospheric pressure, for example. The oxygen partial pressure in the atmosphere of the second heat treatment is equal to or more than 30%, for example.

The connection layer 30 is formed by the first heat treatment and the second heat treatment.

By the above method, the first superconducting layer 16 and the second superconducting layer 26 are connected. By the above method, the connection structure 100 according to the first embodiment is formed.

Next, effects of the connection structure for a superconducting layer and the connection method for a superconducting layer according to the first embodiment will be described.

For example, in a nuclear magnetic resonance device (NMR) or a magnetic resonance imaging device (MRI), a superconducting coil is used to generate a strong magnetic field. The superconducting coil is formed by winding a superconducting wire around a winding frame.

To lengthen the superconducting wire, a plurality of superconducting wires are connected, for example. For example, the ends of two superconducting wires are connected using a connection structure. The connection structure for connecting the superconducting wires is required to have low electric resistance and high mechanical strength.

In the connection method for a superconducting layer according to the first embodiment, when the first superconducting layer 16 and the second superconducting layer 26 are to be connected, the slurry 29 in which the first crystal grain 31, the first grain 33, the second grain 34, and the third grain 35 are mixed is used. The first crystal grain 31 is a superconductor of rare earth oxide. The first grain 33, the second grain 34, and the third grain 35 are raw materials for the superconductor of rare earth oxide. By forming the connection layer 30 using the slurry 29 in which the crystal grain of the superconductor and the plurality of grains serving as raw materials for the superconductor are mixed, the connection structure 100 having low electric resistance and high mechanical strength can be achieved. The detail will be described below.

As a connection method for a superconducting layer according to a first comparative example, considered is a case in which a connection layer is formed with use of slurry including a crystal grain of a superconductor and riot including a plurality of grains serving as raw materials for the superconductor. The sintering temperature of the superconductor grains is higher than the sintering temperature of the raw material grains for the superconductor or the sintering temperature of the raw material grains for the superconductor and the superconductor grains.

For this reason, in a case in which the connection layer is formed using the slurry including only, the crystal grains of the superconductor, the heat treatment for sintering needs to be performed at a high temperature of equal to or higher than 900° C., for example. In a case in which sintering is riot performed at a high temperature, the bonds between the superconductor grains are weakened, and the mechanical strength of the connection layer is lowered.

However, in a case in which sintering is performed at a high temperature, the superconductivity of the superconducting layer may be degraded or lost. The degradation or the loss of the superconductivity of the superconducting layer is considered to occur due to a reaction between the superconducting layer and the intermediate layer or a phase change of the superconducting layer, for example.

Therefore, it is difficult to form a connection structure having low electric resistance and high mechanical strength by using slurry including only the crystal grain of the superconductor.

As a connection method for a superconducting layer according to a second comparative example, considered is a case in which a connection layer is formed with use of slurry not including a crystal grain of a superconductor and including a plurality of grains serving as raw materials for the superconductor.

As described above, the sintering temperature of the raw material grains for the superconductor is lower than the sintering temperature of the superconductor grains. Therefore, in the case of the second comparative example, sintering between grains progresses further even in a case in which the sintering is performed at a low temperature, and the mechanical strength of the connection layer can be higher than in the case of the first comparative example. Also, as a result of a reaction of the raw material grains, the crystal grains of the superconductor are formed, and the connection layer has superconductivity. Therefore, it can be expected to achieve low electric resistance.

Figure 10:
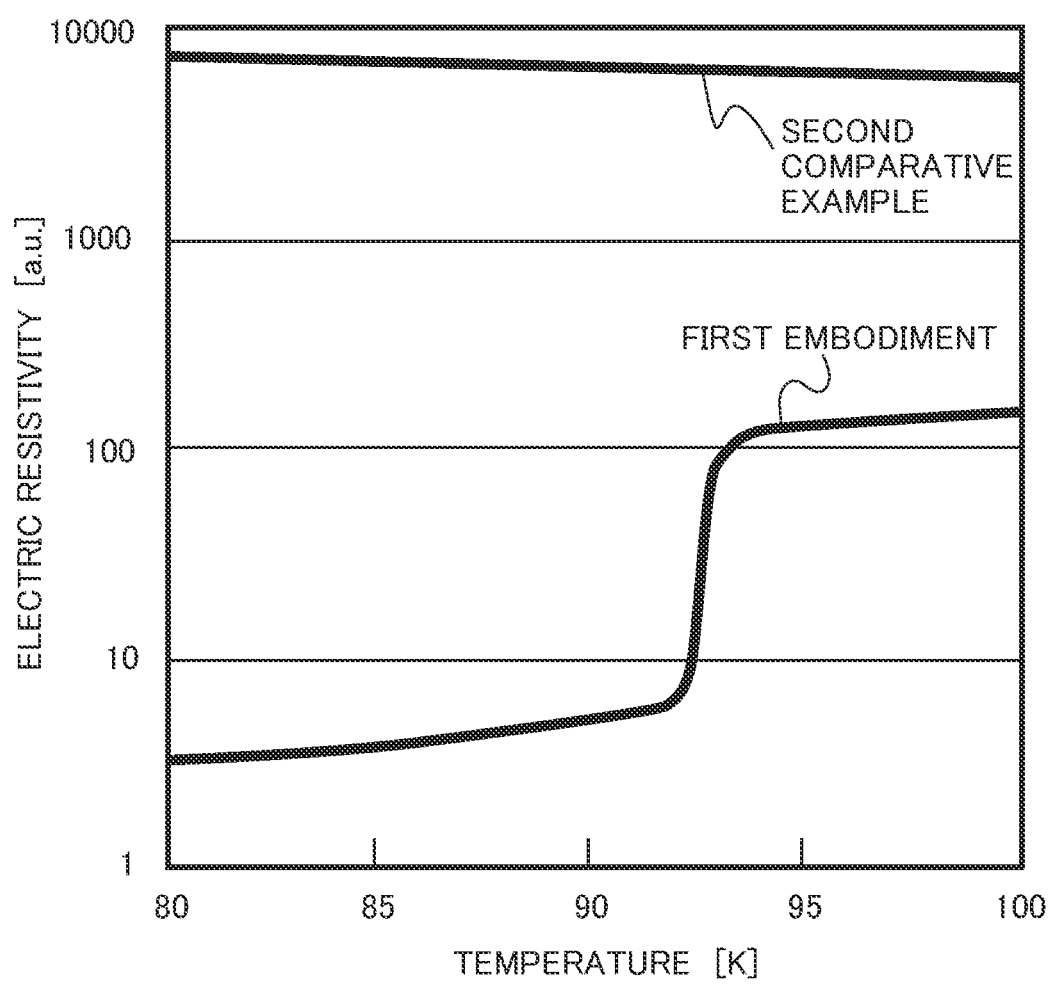
FIG. 10 illustrates temperature dependence of electric resistivity in the first embodiment and a second comparative example.

FIG. 10 is an explanatory diagram of effects of the connection structure according to the first embodiment. FIG. 10 illustrates temperature dependence of electric resistivity of the connection structure 100 for a superconducting layer formed in the connection method according to the first embodiment and the connection structure for a superconducting layer formed in the connection method according to the second comparative example.

In the case of FIG. 10, each of the measured connection structures in the case of the first embodiment and in the case of the second comparative example includes a crystal grain having a chemical composition represented as $GdBa_2Cu_3O_\delta$ ($6 \leq \delta \leq 7$). Also, the sintering temperature is 800° C. in each of the cases of the first embodiment and the second comparative example.

As is apparent from FIG. 10, the connection structure 100 for a superconducting layer formed in the connection method according to the first embodiment exhibits good superconducting characteristics. Accordingly, low electric resistance is achieved. On the other hand, the connection structure for a superconducting layer formed in the connection method according to the second comparative example does not exhibit superconducting characteristics and exhibits high electric resistance.

The reason why the connection structure for a superconducting layer according to the second comparative example does not exhibit superconducting characteristics and exhibits high electric resistance despite the formation of the crystal grains of the superconductor is considered as follows.

The first reason is that the grain size of the crystal grain of the superconductor is small, and that the ratio of the grain interface in the connection layer increases, which causes the interface resistance to be dominant. The second reason is that the superconductor has poor crystallinity since sintering is performed at a low temperature.

In the connection structure 100 for a superconducting layer according to the first embodiment, the grain size of the first crystal grain 31 included in the slurry 29 in advance is larger than the grain size of the second crystal grain 32 formed as a result of a reaction of the raw material grains. That is, the grain size distribution of the crystal grains of the superconductor in the connection layer 30 includes a bimodal distribution. The presence of crystal grains having a large grain size causes the ratio of the grain interface in the connection layer 30 to decrease.

Also, the crystallinity of the first crystal grain 31 included in the slurry 29 in advance is better than the crystallinity of the second crystal grain 32 formed as a result of a reaction of the raw material grains at a low temperature. The reason for this is that the first crystal grain 31 is formed by sintering at a high temperature, for example.

Therefore, the connection structure 100 for a superconducting layer according to the first embodiment is considered to exhibit better superconducting characteristics and to be able to achieve lower electric resistance than the connection structure according to the second comparative example.

Also, in the connection structure 100 for a superconducting layer according to the first embodiment, the mechanical strength of the connection layer 30 is heightened due to the sintering effect of the raw material grains for the superconductor and the sintering effect of the crystal grains of the superconductor and the raw material grains.

The connection structure 100 for a superconducting layer according to the first embodiment can easily be formed by using the connection method for a superconducting layer according to the first embodiment.

The first grain size d1 corresponding to the first peak Pk1 of the connection layer 30 is preferably equal to or more than 100 nm and equal to or less than 10 µm, more preferably equal to or more than 500 nm and equal to or less than 8 µm, and further preferably equal to or more than 1 µm and equal to or less than 5 µm. Since the grain size exceeds the above lower limit, the ratio of the grain interface in the connection layer 30 decreases. Therefore, the electric resistance of the connection structure 100 is lowered. Also, since the grain size falls below the above upper limit, the ratio of the grain interface in the connection layer 30 increases. Therefore, the mechanical strength of the connection structure 100 is improved.

The first grain size d1 is preferably equal to or more than 10 times and equal to or less than 1000 times, and more preferably equal to or more than 50 times and equal to or less than 500 times the second grain size d2. Since the grain size exceeds the above lower limit, the ratio of the grain interface in the connection layer 30 decreases. Therefore, the electric resistance of the connection structure 100 is lowered. Also, since the grain size falls below the above upper limit, the ratio of the grain interface in the connection layer 30 increases. Therefore, the mechanical strength of the connection structure 100 is improved.

Among the crystal grains of both the first crystal grains 31 and the second crystal grains 32, the ratio of crystal grains having a grain size of equal to or more than 100 nm and equal to or less than 10 µm is preferably equal to or more than 1% and equal to or less than 50%, and more preferably equal to or more than 10% and equal to or less than 30% in terms of number. Since the grain size exceeds the above lower limit, the ratio of the grain interface in the connection layer 30 decreases. Therefore, the electric resistance of the connection structure 100 is lowered. Also, since the grain size falls below the above upper limit, the ratio of the grain interface in the connection layer 30 increases. Therefore, the mechanical strength of the connection structure 100 is improved.

The connection layer 30 preferably contains sodium (Na). Since the connection layer 30 contains sodium (Na), the sinterability of the grains in the connection layer 30 is improved. Therefore, the mechanical strength of the connection structure 100 is improved.

The atomic concentration of sodium (Na) contained in the connection layer 30 is preferably equal to or more than 0.01% and equal to or less than 1%, and more preferably equal to or more than 0.1% and equal to or less than 0.5%. Since the atomic concentration exceeds the above lower limit, the sinterability of the grains in the connection layer 30 is further improved. Therefore, the mechanical strength of the connection structure 100 is further improved.

The first temperature in the first heat treatment is preferably equal to or lower than 850° C., more preferably equal to or lower than 800° C., further preferably equal to or lower than 750° C., and most preferably equal to or lower than 700° C. Since the first temperature falls below the above upper limit, degradation of the superconducting characteristics of the connection structure 100 can be suppressed.

As described above, with the connection structure for a superconducting layer and the connecting method for a superconducting layer according to the first embodiment, low electric resistance and high mechanical strength can be achieved.

Second Embodiment

A connection structure for a superconducting layer according to a second embodiment differs from the connection structure for a superconducting layer according to the first embodiment in that the connection structure for a superconducting layer according to the second embodiment does not include a first grain containing a rare earth element (RE) and oxygen (O), a second grain containing barium (Ba), carbon (C), and oxygen (O), a third grain containing copper (Cu) and oxygen (O), and a fourth grain containing barium (Ba), copper (Cu), and oxygen (O). Hereinbelow, description of the content overlapping with that of the first embodiment may partially be omitted.

Figure 11:
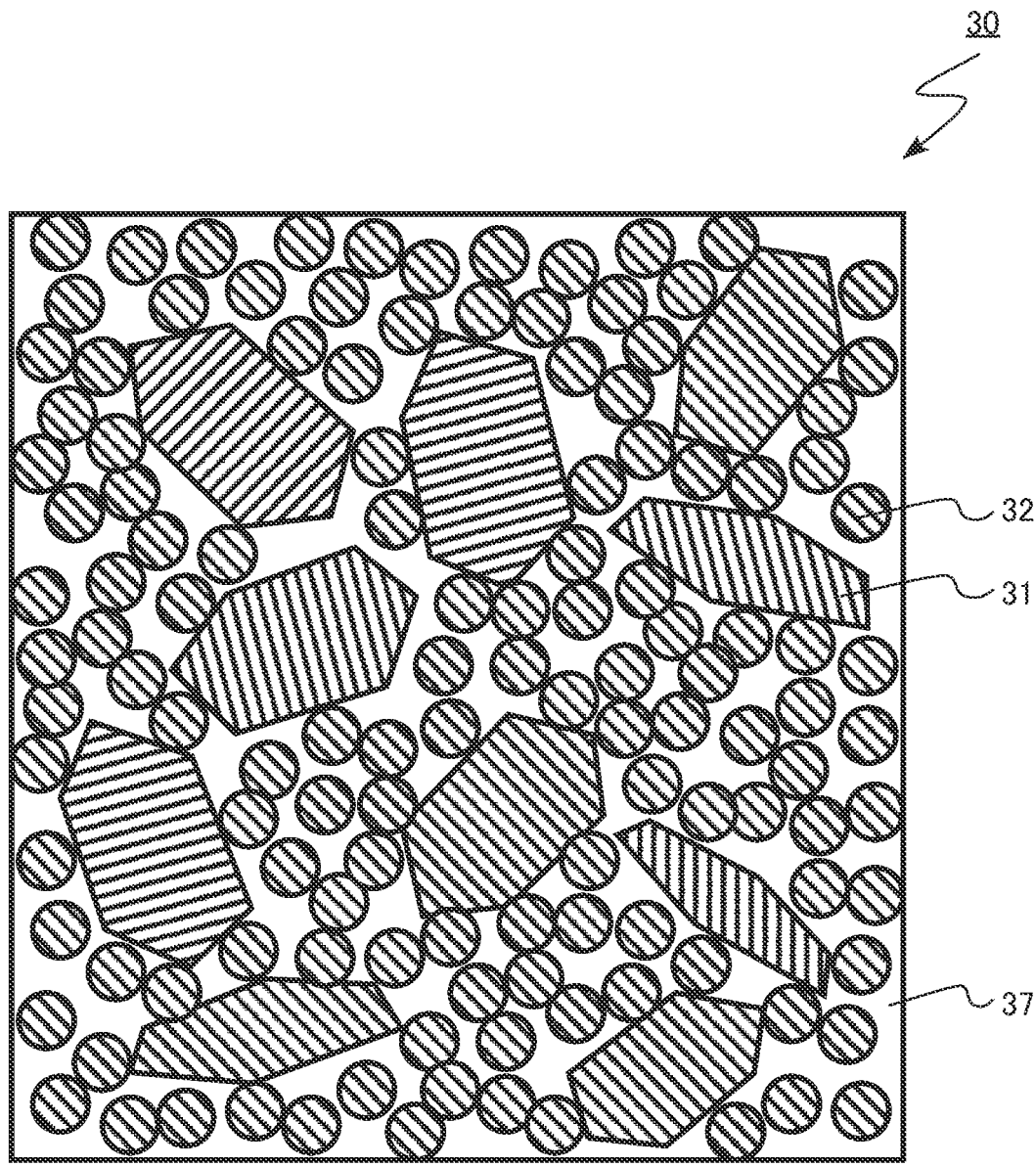
FIG. 11 is an enlarged schematic cross-sectional view of a part of a connection layer according to a second embodiment.

FIG. 11 is an enlarged schematic cross-sectional view of a part of the connection layer according to the second embodiment.

The connection layer 30 includes the first crystal grain 31, the second crystal grain 32, and the void 37. The connection layer 30 is formed by sintering the first crystal grain 31 and the second crystal grain 32.

The connection layer 30 is porous. In the connection layer 30, the void 37 exists between the grains.

The first crystal grain 31 contains a rare earth element (RE), barium (Ba), copper (Cu), and oxygen (O). The first crystal grain 31 is rare earth oxide. The first crystal grain 31 is a single crystal or a polycrystal having a perovskite structure, for example. The first crystal grain 31 has a chemical composition represented as (RE) $Ba_2Cu_3O_\delta$ (RE is a rare earth element, $6 \leq \delta \leq 7$), for example.

The first crystal grain 31 is formed in a plate shape or flat shape, for example. A median of the grain size of the first crystal grain 31 is equal to or more than 100 nm and equal to or less than 10 µm, for example.

The first crystal grain 31 is a superconductor.

The second crystal grain 32 contains a rare earth element (RE), barium (Ba), copper (Cu), and oxygen (O). The second crystal grain 32 is rare earth oxide. The second crystal grain 32 is a single crystal or a polycrystal having a perovskite structure, for example. The second crystal grain 32 has a chemical composition represented as (RE) $Ba_2Cu_3O_\delta$ (RE is a rare earth element, $6 \leq \delta \leq 7$), for example.

The second crystal grain 32 contains an equal rare earth element to that of the first crystal grain 31, for example. The chemical composition of the second crystal grain 32 is equal to the chemical composition of the first crystal grain 31, for example. A case in which the chemical composition of the second crystal grain 32 and the chemical composition of the first crystal grain 31 are equal is preferable since the connectivity between the first crystal grain 31 and the second crystal grain 32 is improved.

The second crystal grain 32 may contain a different rare earth element from that of the first crystal grain 31, for example. The chemical composition of the second crystal grain 32 may be different from the chemical composition of the first crystal grain 31, for example.

The second crystal grain 32 is formed in a spherical or irregular shape, for example. A median of the grain size of the second crystal grain 32 is lower than the median of the grain size of the first crystal grain 31. The median of the grain size of the second crystal grain 32 is equal to or more than 10 nm and equal to or less than 1 µm, for example.

The second crystal grain 32 is a superconductor.

The connection structure for a superconducting layer according to the second embodiment is formed by using a similar method to the connection method for a superconducting layer according to the first embodiment.

At the time of preparing the slurry 29 in a similar method to the connection method for a superconducting layer according to the first embodiment, the amount ratio and the mixing method of the first grain 33, the second grain 34, and the third grain 35 are appropriately adjusted. As a result, all the raw material grains react to cause the second crystal grains 32 to be generated so that the raw material grains do not remain in the connection layer 30.

The connection layer 30 according to the second embodiment has an increased occupancy of the conductive second crystal grains 32 in the connection layer 30 as compared with the connection layer 30 according to the first embodiment. Therefore, the connection structure for a superconducting layer according to the second embodiment has lower electric resistance than the connection structure for a superconducting layer according to the first embodiment.

As described above, with the connection structure for a superconducting layer according to the second embodiment as well as that according to the first embodiment, low electric resistance and high mechanical strength can be achieved.

Third Embodiment

A connection structure for a superconducting layer according to a third embodiment includes a first superconducting layer, a second superconducting layer, and a connection layer provided between the first superconducting layer and the second superconducting layer, the connection layer including a crystal grain containing a rare earth element (RE), barium (Ba), copper (Cu), and oxygen (O) and at least one grain selected from the group including a first grain containing a rare earth element (RE) and oxygen (O), a second grain containing barium (Ba), carbon (C), and oxygen (O), a third grain containing copper (Cu) and oxygen (O), and a fourth grain containing barium (Ba), copper (Cu), and oxygen (O). The connection structure for a superconducting layer according to the third embodiment differs from the connection structure for a superconducting layer according to the first embodiment in that a grain size distribution of the crystal grains does not include a clear bimodal distribution. Hereinbelow, description of the content overlapping with that of the first embodiment may partially be omitted.

Figure 12:
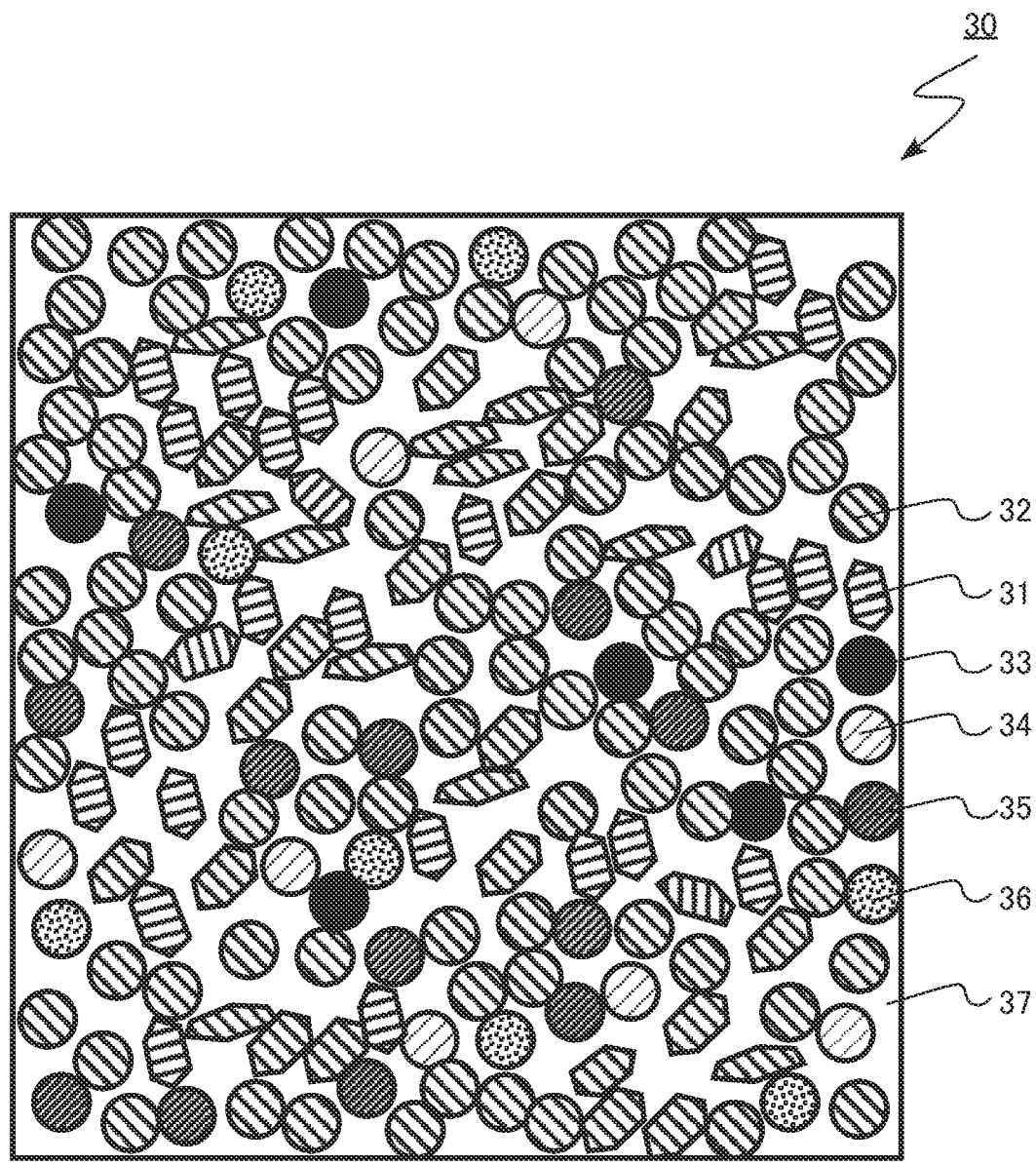
FIG. 12 is an enlarged schematic cross-sectional view of a part of a connection layer according to a third embodiment.

FIG. 12 is an enlarged schematic cross-sectional view of a part of the connection layer according to the third embodiment.

The connection layer 30 includes a first crystal grain 31, a second crystal grain 32, a first grain 33, a second grain 34, a third grain 35, a fourth grain 36, and a void 37. The connection layer 30 is formed by sintering the first crystal grain 31, the second crystal grain 32, the first grain 33, the second grain 34, the third grain 35, and the fourth grain 36.

The connection layer 30 is porous. The void 37 exists between the grains in the connection layer 30.

The first crystal grain 31 contains a rare earth element (RE), barium (Ba), copper (Cu), and oxygen (O). The first crystal grain 31 is rare earth oxide. The first crystal grain 31 is a single crystal or a polycrystal having a perovskite structure, for example. The first crystal grain 31 has a chemical composition represented as (RE) $Ba_2Cu_3O_\delta$ (RE is a rare earth element, $6 \leq \delta \leq 7$), for example.

The first crystal grain 31 is formed in a plate shape or flat shape, for example. A median of the grain size of the first crystal grain 31 is equal to or more than 1 nm and equal to or less than 10 µm, for example.

The first crystal grain 31 is a superconductor.

The second crystal grain 32 contains a rare earth element (RE), barium (Ba), copper (Cu), and oxygen (O). The second crystal grain 32 is rare earth oxide. The second crystal grain 32 is a single crystal or a polycrystal having a perovskite structure, for example. The second crystal grain 32 has a chemical composition represented as (RE) $Ba_2Cu_3O_\delta$ (RE is a rare earth element, $6 \leq \delta \leq 7$), for example.

The second crystal grain 32 contains an equal rare earth element to that of the first crystal grain 31, for example. The chemical composition of the second crystal grain 32 is equal to the chemical composition of the first crystal grain 31, for example. A case in which the chemical composition of the second crystal grain 32 and the chemical composition of the first crystal grain 31 are equal is preferable since the connectivity between the first crystal grain 31 and the second crystal grain 32 is improved.

The second crystal grain 32 may contain a different rare earth element from that of the first crystal grain 31, for example. The chemical composition of the second crystal grain 32 may be different from the chemical composition of the first crystal grain 31, for example.

The second crystal grain 32 is formed in a spherical or irregular shape, for example. A median of the grain size of the second crystal grain 32 is equal to or more than 1 nm and equal to or less than 10 µm, for example.

The second crystal grain 32 is a superconductor.

The grain size distribution of the crystal grains included in the connection layer 30 does not include a clear bimodal distribution.

The crystallinity of the first crystal grain 31 is better than the crystallinity of the second crystal grain 32, for example. Good crystallinity means that the defect density in the crystal is low, for example. The good crystallinity also means that the grain size of the crystal constituting the polycrystalline crystal grain is large.

The first grain 33 contains a rare earth element (RE) and oxygen (O). The first grain 33 and the second crystal grain 32 contain an equal rare earth element (RE). The first grain 33 has a chemical composition represented as $RE_2O_3$ (RE is a rare earth element), for example.

The second grain 34 contains barium (Ba), carbon (C), and oxygen (O). The second grain 34 has a chemical composition represented as $BaCO_3$, for example.

The third grain 35 contains copper (Cu) and oxygen (O). The third grain 35 has a chemical composition represented as CuO, for example.

The fourth grain 36 contains barium (Ba), copper (Cu), and oxygen (O). The fourth grain 36 has a chemical composition represented as $BaCu_xO_y$ ($0 \le x \le 2$, $0 < y \le 4$), for example.

Note that a configuration in which the connection layer 30 includes only one kind of grain selected from the first grain 33, the second grain 34, the third grain 35, and the fourth grain 36 is available. Also, a configuration in which the connection layer 30 includes only two kinds of grain selected from the first grain 33, the second grain 34, the third grain 35, and the fourth grain 36 is available. Further, a configuration in which the connection layer 30 includes only three kinds of grain selected from the first grain 33, the second grain 34. The third grain 35, and the fourth grain 36 is available.

The connection structure for a superconducting layer according to the third embodiment is formed by using a similar method to the connection method for a superconducting layer according to the first embodiment.

At the time of preparing the slurry 29 in a similar method to the connection method for a superconducting layer according to the first embodiment, the grain size of the first crystal grain 31 is appropriately selected, and a heat treatment condition is appropriately adjusted, to control the grain size of the second crystal grain 32. As a result, the grain size distribution of the crystal grains included in the connection layer 30 can be prevented from including a clear bimodal distribution.

The connection layer 30 according to the third embodiment has a higher ratio of the grain interface in the connection layer 30 or has a lower ratio of the void in the connection layer 30 than the connection layer 30 according to the first embodiment. Therefore, the connection structure for a superconducting layer according to the third embodiment has higher mechanical strength than the connection structure for a superconducting layer according to the first embodiment.

As described above, with the connection structure for a superconducting layer according to the third embodiment as well as that according to the first embodiment, low electric resistance and high mechanical strength can be achieved.

Fourth Embodiment

A superconducting wire according to a fourth embodiment includes a first superconducting wire including a first superconducting layer, a second superconducting wire including a second superconducting layer, a third superconducting layer including a first surface and a second surface opposed to the first surface, and a connection layer provided between the first superconducting layer and the third superconducting layer and between the second superconducting layer and the third superconducting layer and including a crystal grain containing a rare earth element (RE), barium (Ba), copper (Cu), and oxygen (O), the crystal grain having a grain size distribution including a bimodal distribution. The first superconducting layer and the second superconducting layer are located on a side on which the first surface of the third superconducting layer resides. The superconducting wire according to the fourth embodiment uses the connection structure for a superconducting layer according to the first embodiment as a structure for connecting the first superconducting wire to the second superconducting wire, Hereinbelow, description of the content overlapping with that of the first embodiment is partially omitted.

Figure 13:
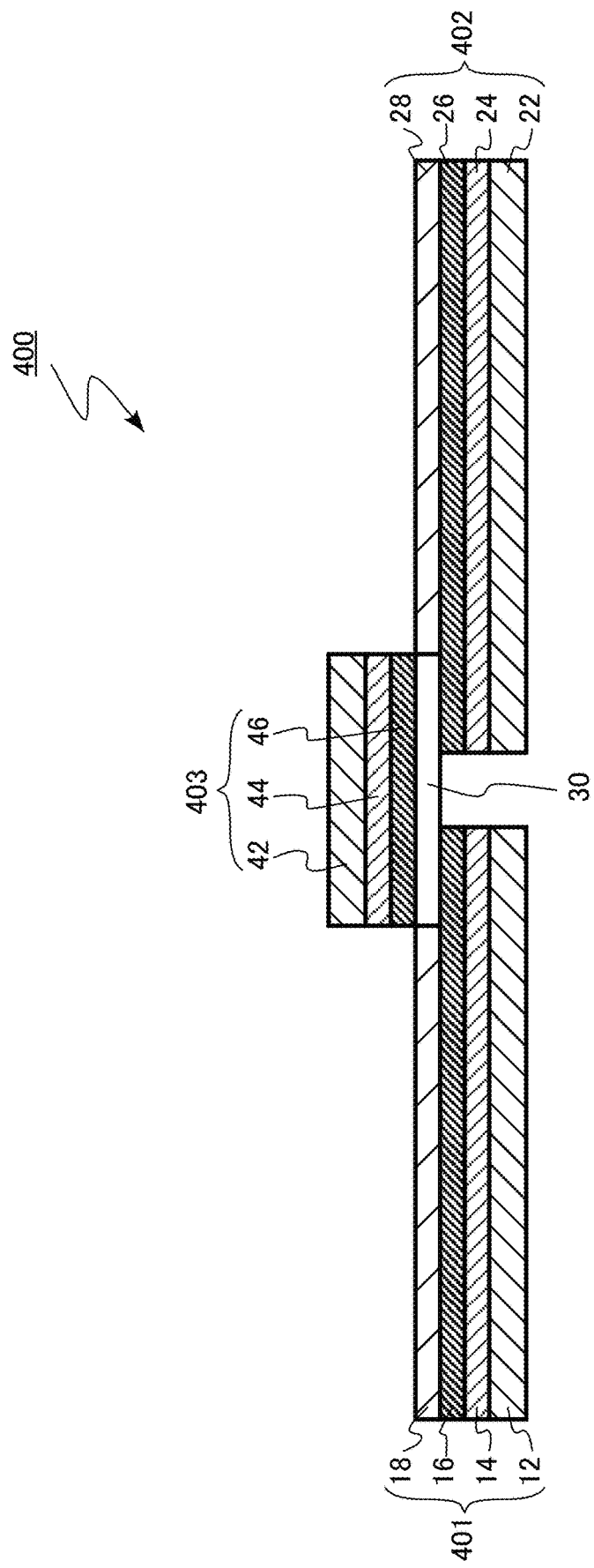
FIG. 13 is a schematic cross-sectional view of a superconducting wire according to a fourth embodiment.

FIG. 13 is a schematic cross-sectional view of the superconducting wire according to the fourth embodiment. A superconducting wire 400 according to the fourth embodiment includes a first superconducting wire 401, a second superconducting wire 402, and a connection member 403. The superconducting wire 400 according to the fourth embodiment is lengthened by connecting the first superconducting wire 401 to the second superconducting wire 402 with use of the connection member 403.

The first superconducting wire 401 includes the first substrate 12, the first intermediate layer 14, the first superconducting layer 16, and the first protective layer 18. The second superconducting wire 402 includes the second substrate 22, the second intermediate layer 24, the second superconducting layer 26, and the second protective layer 28. The connection member 403 includes a third substrate 42, a third intermediate layer 44, and a third superconducting layer 46.

The first substrate 12 is metal, for example. The first substrate 12 is a nickel alloy or a copper alloy, for example. The first substrate 12 is a nickel tungsten alloy, for example.

The first superconducting layer 16 is an oxide superconducting layer, for example. The first superconducting layer 16 contains a rare earth element (RE), barium (Ba), copper (Cu), and oxygen (O), for example. The second superconducting layer 26 contains at least one rare earth element (RE) selected from the group including yttrium (Y), lanthanum (La), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu), for example.

The first superconducting layer 16 contains a single crystal having a perovskite structure, for example.

The first superconducting layer 16 is formed on the first intermediate layer 14 by means of the MOD method, the PLD method, or the MOCVD method, for example.

The first intermediate layer 14 is provided between the first substrate 12 and the first superconducting layer 16. The first intermediate layer 14 is in contact with the first superconducting layer 16, for example. The first intermediate layer 14 has a function of improving crystal orientation of the first superconducting layer 16 formed on the first intermediate layer 14.

The first intermediate layer 14 contains rare earth oxide, for example. The first intermediate layer 14 includes a laminated structure of a plurality of films, for example. The first intermediate layer 14 has a structure in which yttrium oxide ($Y_2O_3$), yttria-stabilized zirconia (YSZ), and cerium oxide ($CeO_2$) are laminated from a side provided with the first substrate 12, for example.

The first protective layer 18 is provided on the first superconducting layer 16. The first protective layer 18 is in contact with the first superconducting layer 16, for example. The first protective layer 18 has a function of protecting the first superconducting layer 16.

The first protective layer 18 is metal, for example. The first protective layer 18 contains silver (Ag) or copper (Cu), for example.

The second substrate 22 is metal, for example. The second substrate 22 is a nickel alloy or a copper alloy, for example. The second substrate 22 is a nickel-tungsten alloy, for example.

The second superconducting layer 26 is an oxide superconducting layer, for example. The second superconducting layer 26 contains a rare earth element (RE), barium (Ba), copper (Cu), and oxygen (O), for example. The second superconducting layer 26 contains at least one rare earth element (RE) selected from the group including yttrium (Y), lanthanum (La), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu), for example.

The second superconducting layer 26 contains a single crystal having a perovskite structure, for example.

The second superconducting layer 26 is formed on the second intermediate layer 24 by means of the MOD method, the PLD method, or the MOCVD method, for example.

The second intermediate layer 24 is provided between the second substrate 22 and the second superconducting layer 26. The second intermediate layer 24 is in contact with the second superconducting layer 26, for example. The second intermediate layer 24 has a function of improving crystal orientation of the second superconducting layer 26 formed on the second intermediate layer 24.

The second intermediate layer 24 contains rare earth oxide, for example. The second intermediate layer 24 includes a laminated structure of a plurality of films, for example. The second intermediate layer 24 has a structure in which yttrium oxide ($Y_2O_3$), yttria-stabilized zirconia (YSZ), and cerium oxide ($CeO_2$) are laminated from a side provided with the second substrate 22, for example.

The second protective layer 28 is provided on the second superconducting layer 26. The second protective layer 28 is in contact with the second superconducting layer 26, for example. The second protective layer 28 has a function of protecting the second superconducting layer 26.

The second protective layer 28 is metal, for example. The second protective layer 28 contains silver (Ag) or copper (Cu), for example.

The third substrate 42 is metal, for example. The third substrate 42 is a nickel alloy or a copper alloy, for example. The third substrate 42 is a nickel-tungsten alloy, for example.

The third superconducting layer 46 includes a first surface and a second surface. The first superconducting layer 16 and the second superconducting layer 26 are located on a side on which the first surface of the third superconducting layer 46 resides. In FIG. 13, the first surface is a lower surface of the third superconducting layer 46, and the second surface is an upper surface of the third superconducting layer 46. The first superconducting layer 16 and the second superconducting layer 26 are located on a side on which the lower surface of the third superconducting layer 46 resides.

The third superconducting layer 46 is an oxide superconducting layer, for example. The third superconducting layer 46 contains a rare earth element (RE), barium (Ba), copper (Cu), and oxygen (O), for example. The third superconducting layer 46 contains at least one rare earth element (RE) selected from the group including yttrium (Y), lanthanum (La), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu), for example.

The third superconducting layer 46 contains a single crystal having a perovskite structure, for example.

The third superconducting layer 46 is formed on the third intermediate layer 44 by means of the MOD method, the PLD method, or the MOCVD method, for example.

The third intermediate layer 44 is provided between the third substrate 42 and the third superconducting layer 46. The third intermediate layer 44 is in contact with the third superconducting layer 46, for example. The third intermediate layer 44 has a function of improving crystal orientation of the third superconducting layer 46 formed on the third intermediate layer 44.

The third intermediate layer 44 contains rare earth oxide, for example. The third intermediate layer 44 includes a laminated structure of a plurality of films, for example. The third intermediate layer 44 has a structure in which yttrium oxide ($Y_2O_3$), yttria-stabilized zirconia (YSZ), and cerium oxide ($CeO_2$) are laminated from a side provided with the third substrate 42, for example.

For example, no protective layer is provided in contact with the third superconducting layer 46. For example, no metal protective layer is provided in contact with the third superconducting layer 46. For example, no protective layer is provided in contact with the third superconducting layer 46 and containing silver (Ag) or copper (Cu).

The connection layer 30 is provided between the first superconducting layer 16 and the third superconducting layer 46. The connection layer 30 is in contact with the first superconducting layer 16. The connection layer 30 is in contact with the third superconducting layer 46.

The connection layer 30 is provided between the second superconducting layer 26 and the third superconducting layer 46. The connection layer 30 is in contact with the second superconducting layer 26. The connection layer 30 is in contact with the third superconducting layer 46.

The connection layer 30 between the first superconducting layer 16 and the third superconducting layer 46 and the connection layer 30 between the second superconducting layer 26 and the third superconducting layer 46 are continuous.

The connection layer 30 does not exist between the first superconducting layer 16 and the second superconducting layer 26, for example. An air gap exists between the first superconducting layer 16 and the second superconducting layer 26, for example.

The connection layer 30 is an oxide superconducting layer. The connection layer 30 contains a rare earth element (RE), barium (Ba), copper (Cu), and oxygen (O). The connection layer 30 contains a rare earth element (RE), barium (Ba), copper (Cu), and oxygen (O) for example. The connection layer 30 contains at least one rare earth element (RE) selected from the group including yttrium (Y), lanthanum (La), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu), for example.

The connection layer 30 according to the fourth embodiment has a similar configuration to that of the connection layer 30 according to the first embodiment illustrated in FIG. 2.

The connection layer 30 includes a first crystal grain 31, a second crystal grain 32, a first grain 33, a second grain 34, a third grain 35, a fourth grain 36, and a void 37. The connection layer 30 is formed by sintering the first crystal grain 31, the second crystal grain 32, the first grain 33, the second grain 34, the third grain 35, and the fourth grain 36.

The connection layer 30 is porous. The void 37 exists between the grains in the connection layer 30.

The first crystal grain 31 contains a rare earth element (RE), barium (Ba), copper (Cu), and oxygen (O). The first crystal grain 31 is rare earth oxide. The first crystal grain 31 is a single crystal or a polycrystal having a perovskite structure, for example. The first crystal grain 31 has a chemical composition represented as (RE)$Ba_2Cu_3O_\delta$ (RE is a rare earth element, $6 \leq \delta \leq 7$), for example.

The first crystal grain 31 is formed in a plate shape or flat shape, for example. A median of the grain size of the first crystal grain 31 is equal to or more than 100 nm and equal to or less than 10 µm, for example.

The first crystal grain 31 is a superconductor.

The second crystal grain 32 contains a rare earth element (RE), barium (Ba), copper (Cu), and oxygen (O). The second crystal grain 32 is rare earth oxide. The second crystal grain 32 is a single crystal or a polycrystal having a perovskite structure, for example. The second crystal grain 32 has a chemical composition represented as $(RE)Ba_2Cu_3O_\delta$ (RE is a rare earth element, $6 \leq \delta \leq 7$), for example.

The second crystal grain 32 contains an equal rare earth element to that of the first crystal grain 31, for example. The chemical composition of the second crystal grain 32 is equal to the chemical composition of the first crystal grain 31, for example. A case in which the chemical composition of the second crystal grain 32 and the chemical composition of the first crystal grain 31 are equal is preferable since the connectivity between the first crystal grain 31 and the second crystal grain 32 is improved.

The second crystal grain 32 may contain a different rare earth element from that of the first crystal grain 31, for example. The chemical composition of the second crystal grain 32 may be different from the chemical composition of the first crystal grain 31, for example.

The second crystal grain 32 is formed in a spherical or irregular shape, for example. A median of the grain size of the second crystal grain 32 is lower than the median of the grain size of the first crystal grain 31. The median of the grain size of the second crystal grain 32 is equal to or more than 10 nm and equal to or less than 1 µm, for example.

The second crystal grain 32 is a superconductor.

The grain size distribution of the crystal grains included in the connection layer 30 includes a bimodal distribution. The bimodal distribution includes a first distribution including a first peak (Pk1 in FIG. 3) and a second distribution including a second peak (Pk2 in FIG. 3).

Note that the grain size distribution of the crystal grains included in the connection layer 30 may be a multimodal distribution including three or more peaks.

The grain size of the crystal grains corresponding to the first peak is a first grain size (d1 in FIG. 3). The grain size of the crystal grains corresponding to the second peak is a second grain size (d2 in FIG. 3).

The first grain size d1 is larger than the second grain size d2. The first grain size d1 is equal to or more than 10 times and equal to or less than 1000 times the second grain size d2, for example.

The first grain size d1 is equal to or more than 100 nm and equal to or less than 10 µm, for example. The second grain size d2 is equal to or more than 10 nm and equal to or less than 1 µm, for example.

The first distribution mainly includes the first crystal grains 31. The second distribution mainly includes the second crystal grains 32.

The crystal grains having the grain size corresponding to the first distribution include crystal grains formed in plate shape or flat shapes, for example. The crystal grains having the grain size corresponding to the second distribution include crystal grains formed in spherical or irregular shapes, for example.

Among the crystal grains of both the first crystal grains 31 and the second crystal grains 32, the ratio of crystal grains having a grain size of equal to or more than 100 nm and equal to or less than 10 µm is equal to or more than 1% and equal to or less than 50% in terms of number, for example.

The first grain 33 contains a rare earth element (RE) and oxygen (O). The first grain 33 and the second crystal grain 32 contain an equal rare earth element (RE). The first grain 33 has a chemical composition represented as $RE_2O_3$ (RE is a rare earth element), for example.

The first grain 33 is crystalline, for example. The first grain 33 is formed in a spherical or irregular shape, for example. A median of the grain size of the first grain 33 is lower than the median of the grain size of the first crystal grain 31. The median of the grain size of the first grain 33 is equal to or more than 1 nm and equal to or less than 100 nm, for example.

The second grain 34 contains barium (Ba), carbon (C), and oxygen (O). The second grain 34 has a chemical composition represented as $BaCO_3$, for example.

The second grain 34 is crystalline, for example. The second grain 34 is formed in a spherical or irregular shape, for example. A median of the grain size of the second grain 34 is lower than the median of the grain size of the first crystal grain 31. The median of the grain size of the second grain 34 is equal to or more than 1 nm and equal to or less than 1 µm, for example.

The third grain 35 contains copper (Cu) and oxygen (O). The third grain 35 has a chemical composition represented as CuO, for example.

The third grain 35 is crystalline, for example. The third grain 35 is formed in a spherical or irregular shape, for example. A median of the grain size of the third grain 35 is lower than the median of the grain size of the first crystal grain 31. The median of the grain size of the third grain 35 is equal to or more than 1 nm and equal to or less than 100 nm, for example.

The fourth grain 36 contains barium (Ba), copper (Cu), and oxygen (O). The fourth grain 36 has a chemical composition represented as $BaCuxOy$ ($0 \leq x \leq 2$, $0 < y \leq 4$), for example.

The fourth grain 36 is crystalline, for example. The fourth grain 36 is formed in a spherical or irregular shape, for example. A median of the grain size of the fourth grain 36 is lower than the median of the grain size of the first crystal grain 31. The median of the grain size of the fourth grain 36 is equal to or more than 1 nm and equal to or less than 1 µm, for example.

The chemical compositions of the first grain 33, the second grain 34, the third grain 35, and the fourth grain 36 are different. Also, the chemical compositions of the first grain 33, the second grain 34, the third grain 35, and the fourth grain 36 are different from any of the chemical compositions of the first crystal grain 31 and the second crystal grain 32.

Among the first crystal grains 31, the second crystal grains 32, the first grains 33, the second grains 34, the third grains 35, and the fourth grains 36, the ratio of the first grains 33, the second grains 34, the third grains 35, and the fourth grains 36 is equal to or more than 0.1% and equal to or less than 10% in terms of number, for example.

Note that a configuration in which the connection layer 30 includes only one kind of grain selected from the first grain 33, the second grain 34, the third grain 35, and the fourth grain 36 is available. Also, a configuration in which the connection layer 30 includes only two kinds of grain selected from the first grain 33, the second grain 34, the third grain 35, and the fourth grain 36 is available. Further, a configuration in which the connection layer 30 includes only three kinds of grain selected from the first grain 33, the second grain 34, the third grain 35, and the fourth grain 36 is available.

The connection layer 30 contains sodium (Na), for example. The atomic concentration of sodium (Na) contained in the connection layer 30 is equal to or more than 0.01% and equal to or less than 1%, for example.

Measurement of atomic concentration of sodium (Na) contained in the connection layer 30 can be performed by means of energy dispersive X-ray spectroscopy (EDX) or wavelength dispersive X-ray analysis (WDX), for example. The atomic concentration of sodium (Na) is an atomic concentration whose denominator is the amount of all atoms measured by means of the WDX or the EDX.

In the superconducting wire 400 according to the fourth embodiment, current flows from the first superconducting wire 401 through the connection layer 30, the connection member 403, and the connection layer 30 to the second superconducting wire 402, for example.

The first superconducting wire 401 and the connection member 403 are connected with use of the connection layer 30 to cause a connection structure for connecting the first superconducting wire 401 to the connection member 403 to have low electric resistance and high mechanical strength. Also, the second superconducting wire 402 and the connection member 403 are connected with use of the connection layer 30 to cause a connection structure for connecting the second superconducting wire 402 to the connection member 403 to have low electric resistance and high mechanical strength.

Accordingly, a connection structure for connecting the first superconducting wire 401 to the second superconducting wire 402 has low electric resistance and high mechanical strength. Therefore, the superconducting wire 400 has low electric resistance and high mechanical strength.

Note that a further lengthened superconducting wire can be formed by connecting three or more superconducting wires.

In the superconducting wire according to the fourth embodiment, although the case in which the connection structure for a superconducting layer according to the first embodiment is used has been described as an example, the connection structure according to the second embodiment can be used instead of the connection structure for a superconducting layer according to the first embodiment. That is, the connection layer described in the second embodiment can be used for the connection layer 30.

Modification Example

Figure 14:
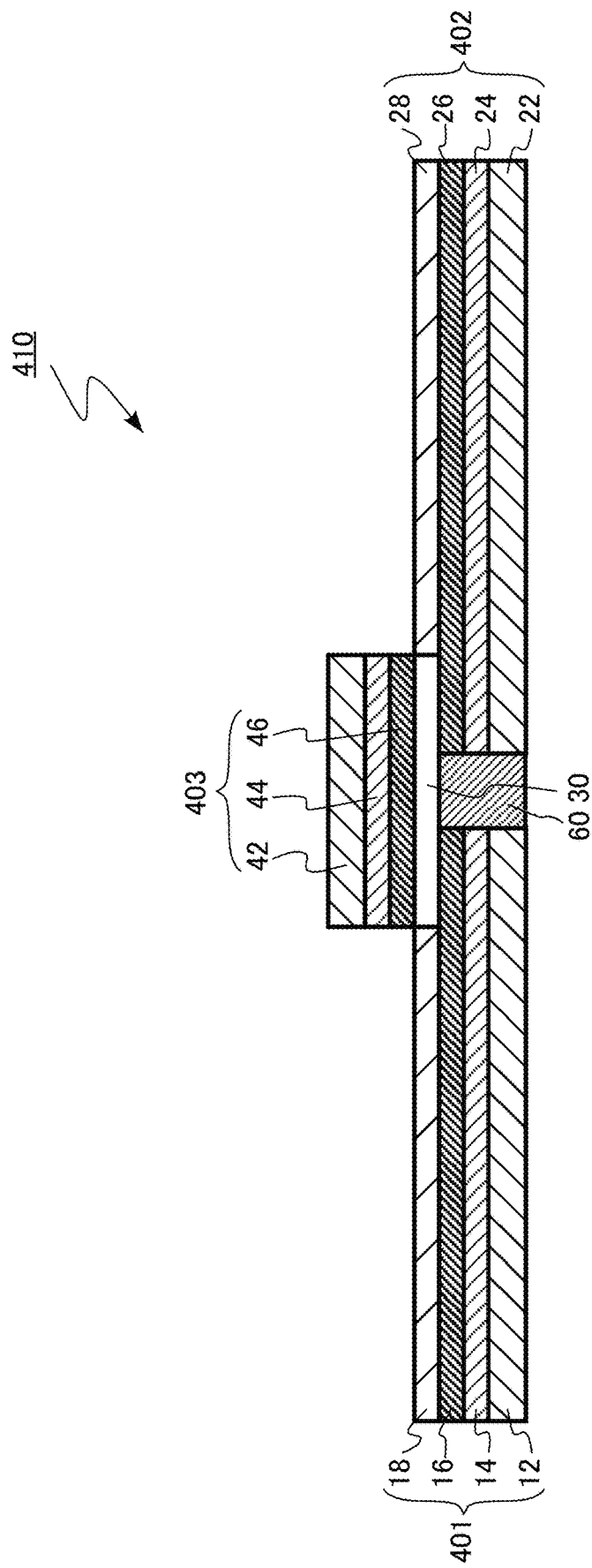
FIG. 14 is a schematic cross-sectional view of a modification example of the superconducting wire according to the fourth embodiment.

FIG. 14 is a schematic cross-sectional view of a modification example of the superconducting wire according to the fourth embodiment. A superconducting wire 410 according to a modification example of the fourth embodiment differs from the superconducting wire 400 according to the fourth embodiment in that a reinforcing material 60 is provided.

The reinforcing material 60 is provided between the first superconducting wire 401 and the second superconducting wire 402. The reinforcing material 60 is provided between the first superconducting layer 16 and the second superconducting layer 26, for example.

The reinforcing member 60 is in contact with the first superconducting wire 401 and the second superconducting wire 402, for example. The reinforcing material 60 is in contact with the connection layer 30, for example.

The reinforcing material 60 is provided to cause the mechanical strength of the superconducting wire 410 to be improved.

The reinforcing material 60 is metal or resin, for example. The reinforcing material 60 is solder, for example. The reinforcing material 60 is solder containing silver (Ag) and indium (In), for example.

As described above, according to the fourth embodiment, the superconducting wire can be achieved lengthened by connection of the two superconducting wires and having low electric resistance and high mechanical strength.

Fifth Embodiment

A superconducting wire according to a fifth embodiment includes a first superconducting wire including a first superconducting layer, a second superconducting wire including a second superconducting layer, a third superconducting layer including a first surface and a second surface opposed to the first surface, and a connection layer provided between the first superconducting layer and the third superconducting layer and between the second superconducting layer and the third superconducting layer, the connection layer including a crystal grain containing a rare earth element (RE), barium (Ba), copper (Cu), and oxygen (O), and the connection layer including at least one grain selected from the group including a first grain containing a rare earth element (RE) and oxygen (O), a second grain containing barium (Ba), carbon (C), and oxygen (O), a third grain containing copper (Cu) and oxygen (O), and a fourth grain containing barium (Ba), copper (Cu), and oxygen (O). The first superconducting layer and the second superconducting layer are located on a side on which the first surface of the third superconducting layer resides. The superconducting wire according to the fifth embodiment differs from the superconducting wire according to the fourth embodiment in that the connection layer similar to that in the third embodiment is provided as the connection layer. Hereinbelow, description of the content overlapping with that of the fourth embodiment is partially omitted.

The connection layer 30 according to the fifth embodiment has a similar configuration to that of the connection layer 30 according to the third embodiment illustrated in FIG. 12.

The connection layer 30 includes a first crystal grain 31, a second crystal grain 32, a first grain 33, a second grain 34, a third grain 35, a fourth grain 36, and a void 37. The connection layer 30 is formed by sintering the first crystal grain 31, the second crystal grain 32, the first grain 33, the second grain 34, the third grain 35, and the fourth grain 36.

The connection layer 30 is porous. The void 37 exists between the grains in the connection layer 30.

The first crystal grain 31 contains a rare earth element (RE), barium (Ba), copper (Cu), and oxygen (O). The first crystal grain 31 is rare earth oxide. The first crystal grain 31 is a single crystal or a polycrystal having a perovskite structure, for example. The first crystal grain 31 has a chemical composition represented as (RE) $Ba_2Cu_3O_\delta$ (RE is a rare earth element, $6\leq\delta\leq7$), for example.

The first crystal grain 31 is formed in a plate shape or flat shape, for example. A median of the grain size of the first crystal grain 31 is equal to or more than 1 nm and equal to or less than 10 μm, for example.

The first crystal grain 31 is a superconductor.

The second crystal grain 32 contains a rare earth element (RE), barium (Ba), copper (Cu), and oxygen (O). The second crystal grain 32 is rare earth oxide. The second crystal grain 32 is a single crystal or a polycrystal having a perovskite structure, for example. The second crystal grain 32 has a chemical composition represented as (RE) $Ba_2Cu_3O_\delta$ (RE is a rare earth element, $6 \leq \delta \leq 7$), for example.

The second crystal grain 32 contains an equal rare earth element to that of the first crystal grain 31, for example. The chemical composition of the second crystal grain 32 is equal to the chemical composition of the first crystal grain 31, for example. A case in which the chemical composition of the second crystal grain 32 and the chemical composition of the first crystal grain 31 are equal is preferable since the connectivity between the first crystal grain 31 and the second crystal grain 32 is improved.

The second crystal grain 32 may contain a different rare earth element from that of the first crystal grain 31, for example. The chemical composition of the second crystal grain 32 may be different from the chemical composition of the first crystal grain 31, for example.

The second crystal grain 32 is formed in a spherical or irregular shape, for example. A median of the grain size of the second crystal grain 32 is equal to or more than 1 nm and equal to or less than 10 µm, for example.

The second crystal grain 32 is a superconductor.

The grain size distribution of the crystal grains included in the connection layer 30 does not include a clear bimodal distribution.

The crystallinity of the first crystal grain 31 is better than the crystallinity of the second crystal grain 32, for example.

As described above, according to the fifth embodiment, the superconducting wire can be achieved lengthened by connection of the two superconducting wires and having low electric resistance and high mechanical strength.

Sixth Embodiment

A superconducting wire according to a sixth embodiment differs from the superconducting wire according to the fourth or fifth embodiment in that a connection layer includes a first region and a second region separated from each other. Hereinbelow, description of the content overlapping with that of the fourth or fifth embodiment is partially omitted.

Figure 15:
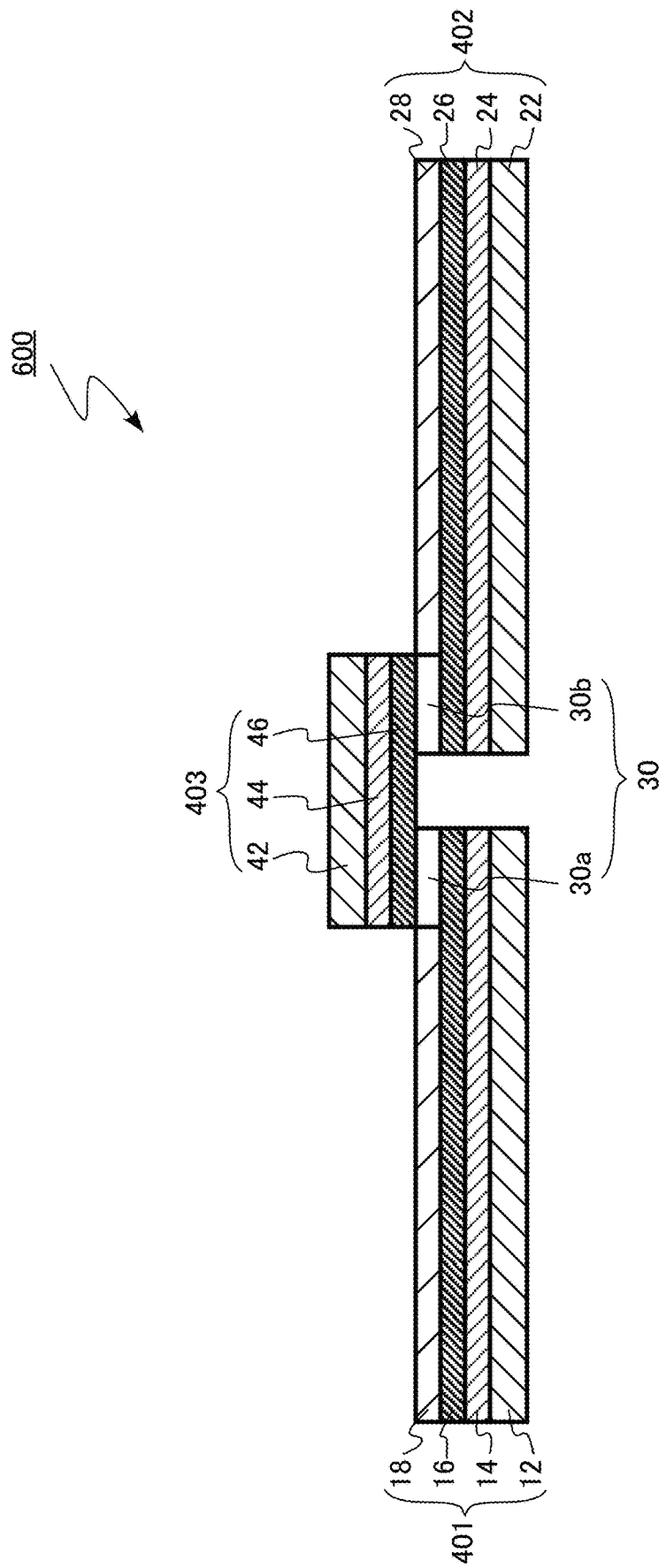
FIG. 15 is a schematic cross-sectional view of a superconducting wire according to a sixth embodiment.

FIG. 15 is a schematic cross-sectional view of the superconducting wire according to the sixth embodiment. A superconducting wire 600 according to the sixth embodiment includes the first superconducting wire 401, the second superconducting wire 402, and the connection member 403. The superconducting wire 600 according to the sixth embodiment is lengthened by connecting the first superconducting wire 401 to the second superconducting wire 402 with use of the connection member 403.

The first superconducting wire 401 includes the first substrate 12, the first intermediate layer 14, the first superconducting layer 16, and the first protective layer 18. The second superconducting wire 402 includes the second substrate 22, the second intermediate layer 24, the second superconducting layer 26, and the second protective layer 28. The connection member 403 includes a third substrate 42, a third intermediate layer 44, and a third superconducting layer 46.

The connection layer 30 includes a first region 30a and a second region 30b. The first region 30a and the second region 30b are separated from each other.

The first region 30a is provided between the first superconducting layer 16 and the third superconducting layer 16. The first region 30a is in contact with the first superconducting layer 16. The first region 30a is in contact with the third superconducting layer 46.

The second region 30b is provided between the second superconducting layer 26 and the third superconducting layer 46. The second region 30b is in contact with the second superconducting layer 26. The second region 30b is in contact with the third superconducting layer 46.

The connection layer 30 according to the sixth embodiment has a similar configuration to that of the connection layer 30 according to the first embodiment illustrated in FIG. 2, the connection layer 30 according to the second embodiment illustrated in FIG. 11, or the connection layer 30 according to the third embodiment illustrated in FIG. 12. Each of the first region 30a and the second region 30b has a similar configuration to that of the connection layer 30 according to the first embodiment illustrated in FIG. 2, the connection layer 30 according to the second embodiment illustrated in FIG. 11, or the connection layer 30 according to the third embodiment illustrated in FIG. 12.

In the superconducting wire 600 according to the sixth embodiment, current flows from the first superconducting wire 401 through the first region 30a of the connection layer 30, the connection member 403, and the second region 30b of the connection layer 30 to the second superconducting wire 402, for example.

First Modification Example

Figure 16:
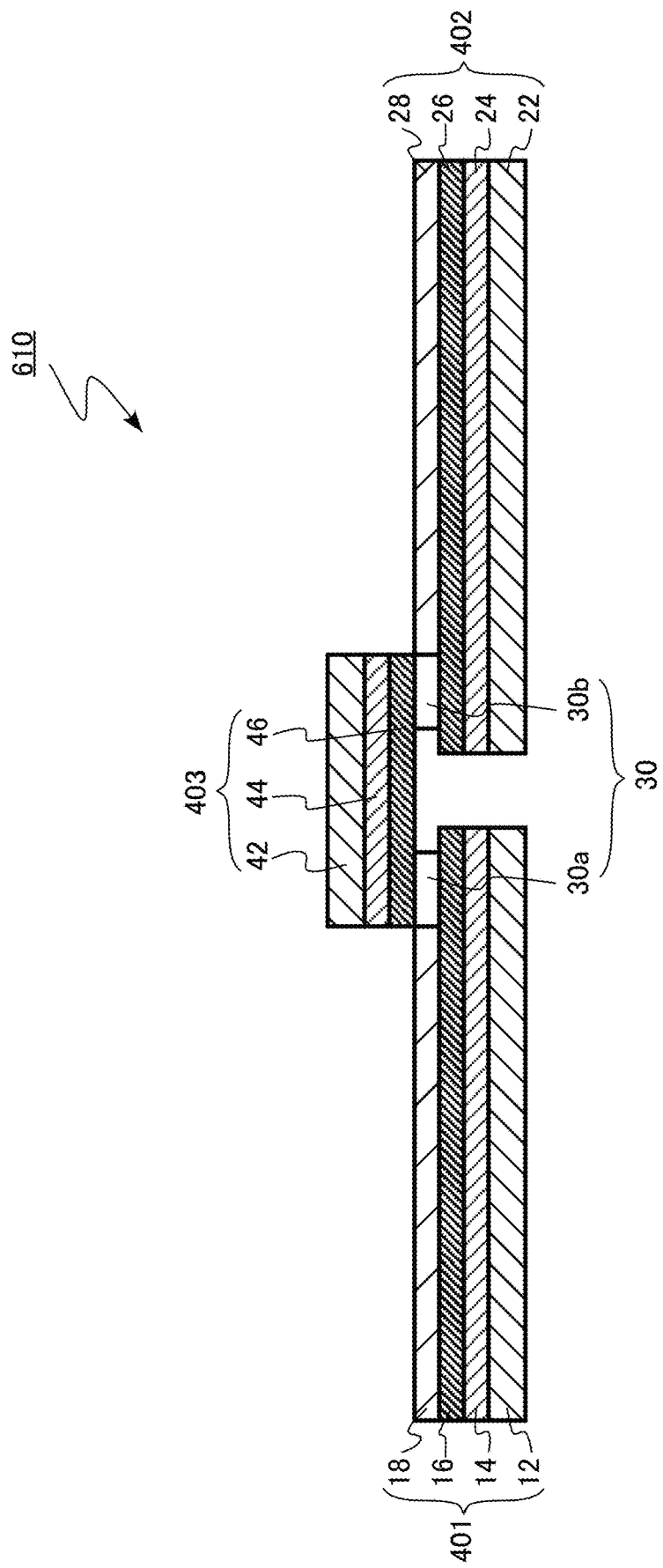
FIG. 16 is a schematic cross-sectional view of a first modification example of the superconducting wire according to the sixth embodiment.

FIG. 16 is a schematic cross-sectional view of a first modification example of the superconducting wire according to the sixth embodiment. A superconducting wire 610 according to the first modification example of the sixth embodiment differs from the superconducting wire 600 according to the sixth embodiment in that a part of a surface of the first superconducting layer 16 opposed to the third superconducting layer 46 is exposed and in that a part of a surface of the second superconducting layer 26 opposed to the third superconducting layer 46 is exposed.

A region exists at which the connection layer 30 does not exist near an end portion, on a side on which the second superconducting layer 26 resides of an upper surface of the first superconducting layer 16. Also, a region exists at which the connection layer 30 does not exist near an end portion, on a side on which the first superconducting layer 16 resides, of an upper surface of the second superconducting layer 26.

Second Modification Example

Figure 17:
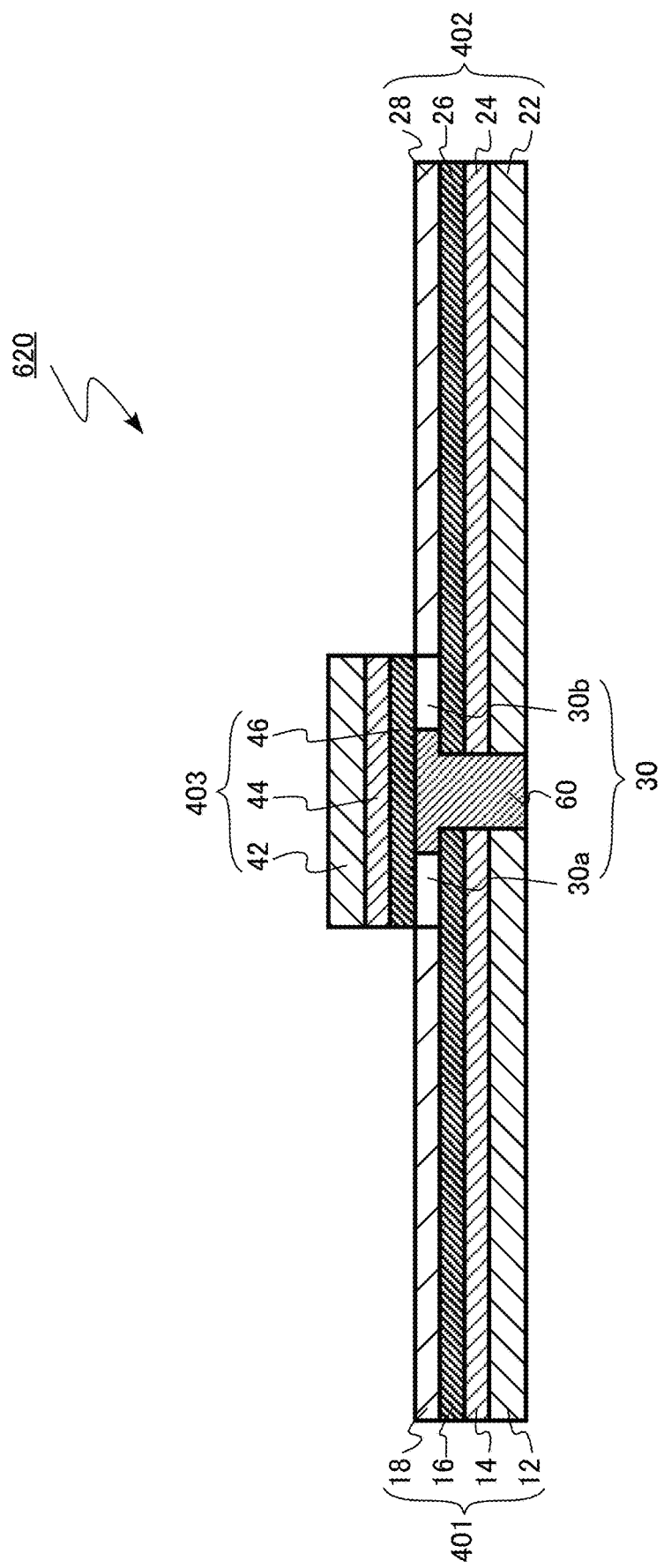
FIG. 17 is a schematic cross-sectional view of a second modification example of the superconducting wire according to the sixth embodiment.

FIG. 17 is a schematic cross-sectional view of a second modification example of the superconducting wire according to the sixth embodiment. A superconducting wire 620 according to the second modification example of the sixth embodiment differs from the superconducting wire 610 according to the first modification example in that the reinforcing material 60 is provided.

The reinforcing material 60 is provided between the first superconducting wire 401 and the second superconducting wire 402. The reinforcing material 60 is provided between the first superconducting layer 16 and the second superconducting layer 26, for example. The reinforcing material 60 is provided between the first superconducting layer 16 and the third superconducting layer 46, for example. The reinforcing material 60 is provided between the second superconducting layer 26 and the third superconducting layer 46, for example. The reinforcing member 60 is provided between the first region 30a and the second region 30b, for example.

The reinforcing material 60 is provided to cause the mechanical strength of the superconducting wire 620 to be improved.

The reinforcing material 60 is metal or resin, for example. The reinforcing material 60 is solder, for example. The reinforcing material 60 is solder containing silver (Ag) and indium (In), for example.

As described above, according to the sixth embodiment, the superconducting wire can be achieved lengthened by connection of the two superconducting wires and having low electric resistance and high mechanical strength.

Seventh Embodiment

A superconducting coil according to a seventh embodiment includes any of the superconducting wires according to the fourth to sixth embodiments. Hereinbelow, description of the content overlapping with that of any of the fourth to sixth embodiments may partially be omitted.

Figure 18:
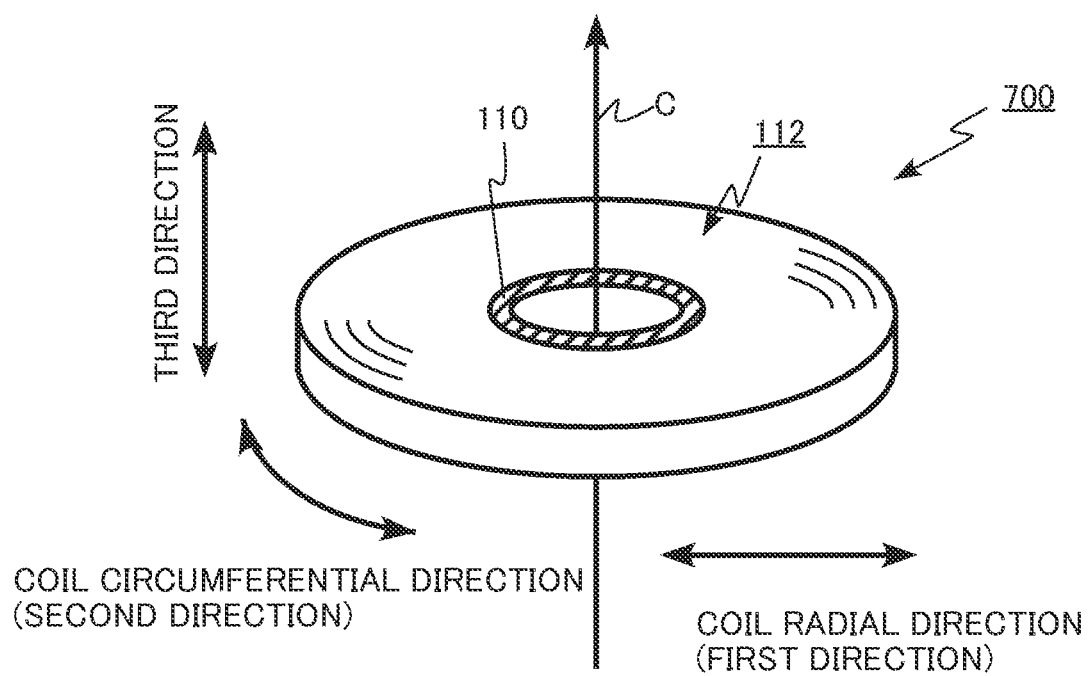
FIG. 18 is a schematic perspective view of a superconducting coil according to a seventh embodiment.
Figure 19:
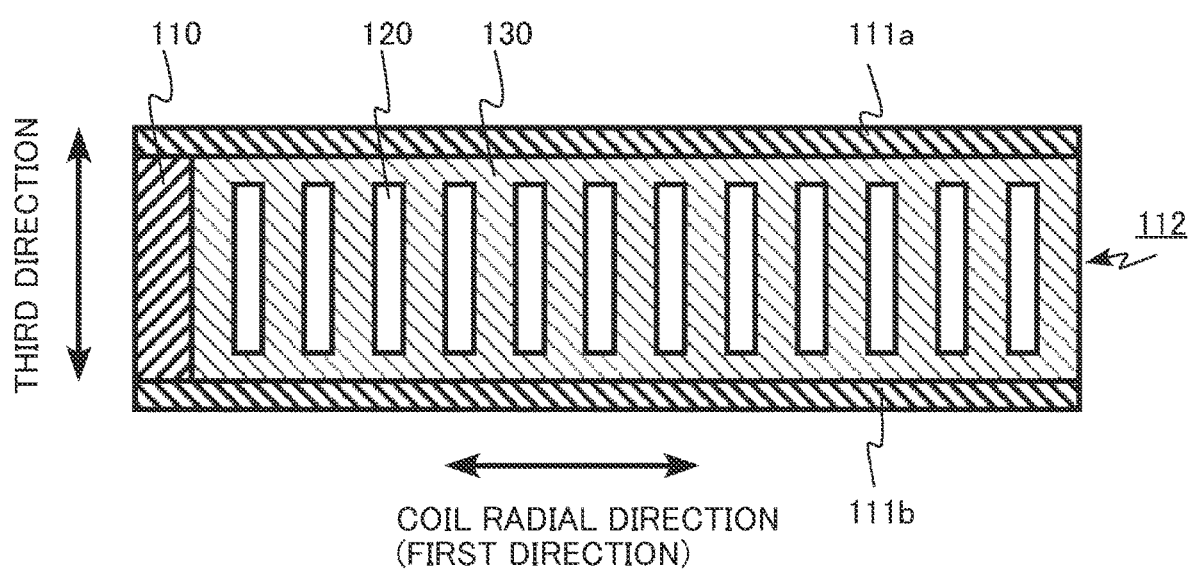
FIG. 19 is a schematic cross-sectional view of the superconducting coil according to the seventh embodiment.

FIG. 18 is a schematic perspective view of a superconducting coil according to the seventh embodiment. FIG. 19 is a schematic cross-sectional view of the superconducting coil according to the seventh embodiment.

A superconducting coil 700 according to the seventh embodiment is used as a coil for generating a magnetic field for a superconducting device such as an NMR, an MRI, a heavy ion radiotherapy device, and a superconducting magnetic levitation railroad vehicle.

The superconducting coil 700 includes a winding frame 110, a first insulating plate 111a, a second insulating plate 111b, and a wire winding portion 112. The wire winding portion 112 includes a superconducting wire 120 and an inter-wire layer 130.

FIG. 18 illustrates a state in which the first insulating plate 111a and the second insulating plate 111b are removed.

The winding frame 110 is made of fiber reinforced plastic, for example. The superconducting wire 120 is formed in a tape shape, for example. As illustrated in FIG. 18, the superconducting wire 120 is wound around the winding frame 110 concentrically in a so-called pancake shape, centering on a winding center C.

The inter-wire layer 130 has a function of securing the superconducting wire 120. The inter-wire layer 130 has a function of restricting the superconducting wire 120 from being damaged by vibration or mutual friction during use of the superconducting device.

The first insulating plate 111a and the second insulating plate 111b are made of fiber reinforced plastic, for example. The first insulating plate 111a and the second insulating plate 111b have a function of insulating the wire winding portion 112 from the outside. The wire winding portion 112 is located between the first insulating plate 111a and the second insulating plate 111b.

As the superconducting wire 120, any of the superconducting wires according to the fourth to sixth embodiments is used.

As described above, according to the seventh embodiment, the superconducting coil having improved characteristics can be achieved as the superconducting coil includes the superconducting wire having low electric resistance and high mechanical strength.

Eighth Embodiment

A superconducting device according to an eighth embodiment is a superconducting device including the superconducting coil according to the seventh embodiment. Hereinbelow, description of the content overlapping with that of the seventh embodiment is partially omitted.

Figure 20:
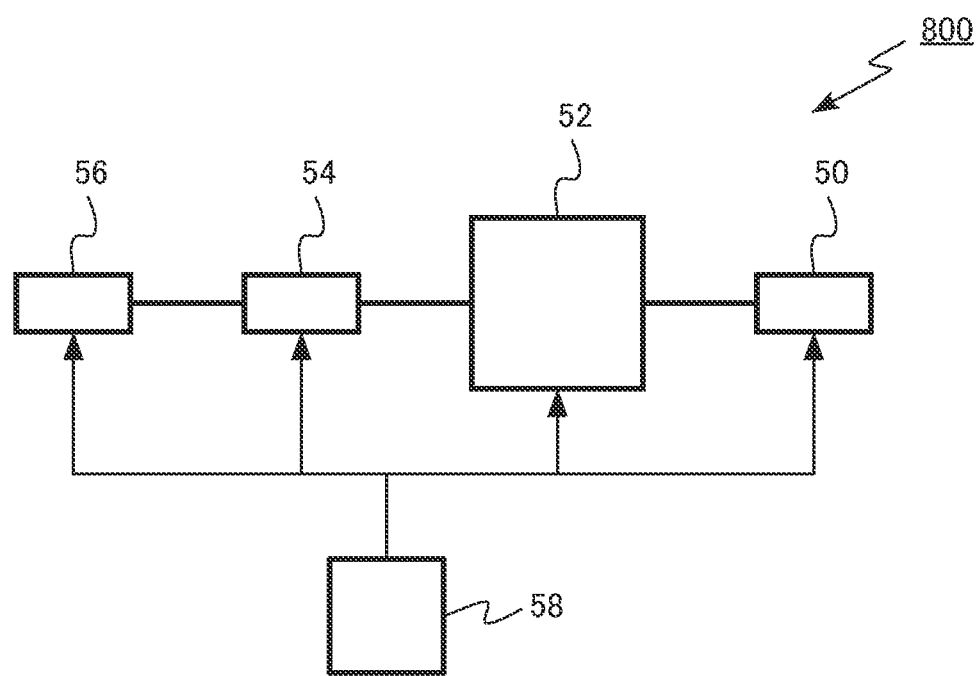
FIG. 20 is a block diagram of a superconducting device according to an eighth embodiment.

FIG. 20 is a block diagram of a superconducting device according to the eighth embodiment. The superconducting device according to the eighth embodiment is a heavy ion radiotherapy device 800. The heavy ion radiotherapy device 800 is an example of a superconducting device.

The heavy ion radiotherapy device 800 includes an incidence system 50, a synchrotron accelerator 52, a beam transport system 54, an irradiation system 56, and a control system 58.

The incidence system. 50 has a function of generating carbon ions for use in treatment and preliminarily accelerating the carbon ions to be incident on the synchrotron accelerator 52, for example. The incidence system 50 includes an ion generation source and a linear accelerator, for example.

The synchrotron accelerator 52 has a function of accelerating the carbon ion beam incident from the incidence system 50 to reach energy appropriate to treatment. The superconducting coil 700 according to the seventh embodiment is used in the synchrotron accelerator 52.

The beam transport system 54 has a function of transporting the carbon ion beam incident from the synchrotron accelerator 52 to the irradiation system 56. The beam transport system 54 includes a bending electromagnet, for example.

The irradiation system 56 has a function of irradiating a patient as an irradiation target with the carbon ion beam incident from the beam transport system 54. The irradiation system 56 includes a rotating gantry enabling irradiation with the carbon ion beam from an arbitrary direction, for example. The superconducting coil 700 according to the seventh embodiment is used in the rotating gantry.

The control system 58 controls the incidence system 50, the synchrotron accelerator 52, the beam transport system 54, and the irradiation system 56. The control system 58 is a computer, for example.

In the heavy ion radiotherapy device 800 according to the eighth embodiment, the superconducting coil 700 according to the seventh embodiment is used in the synchrotron accelerator 52 and the rotating gantry. Accordingly, the heavy ion radiotherapy device 800 having excellent characteristics is achieved.

In the eighth embodiment, although a case in which the heavy ion radiotherapy device 800 is raised as an example of the superconducting device has been described, the superconducting device may be a nuclear magnetic resonance device (NMR), a magnetic resonance imaging device (MRI), or a superconducting magnetic levitation railroad vehicle.

EXAMPLES

Example 1

Three oxide superconducting wires were prepared in which an intermediate layer and a $GdBa_2Cu_3O_{7-\delta}$ layer (oxide superconducting layer) were formed on a Hastelloy substrate and were covered with a protective layer of silver and copper. The length of one wire was 2 cm, and the length of each of the two remaining wires was 10 cm. A portion between both ends of the 2-cm wire and a 1-cm portion from one end of each of the two 10-cm wires were wet-etched with use of a mixed solution of nitric acid, ammonia, and hydrogen peroxide to expose the oxide superconducting layers.

Powders of $Gd_2O_3$, $BaCO_3$, and $CuO$ were prepared, weighed appropriately, and mixed sufficiently, and the mixed powder was compression-molded to prepare a green compact. The obtained green compact was sintered at 930° C. to prepare an oxide superconductor having a composition of $GdBa_2Cu_3O_\delta$ ($6 \le \delta \le 7$). The obtained oxide superconductor was pulverized to prepare a superconductor powder having a median of the grain size (grain size) of about 3 μm.

The obtained superconductor powder, a $Gd_2O_3$ powder having a grain size of about 50 nm, a $BaCO_3$ powder having a grain size of about 70 nm, and a CuO powder having a grain size of about 30 nm were mixed using a mortar. The obtained mixed powder was supplied with water and sodium alginate to prepare slurry.

After the obtained slurry was applied to the exposed oxide superconducting layer of the aforementioned 2-cm superconducting wire, the portion of the 2-cm superconducting wire to which the slurry was applied and the portions of the 10-cm superconducting wires in which the superconducting layers were exposed were opposed, superposed, and sandwiched between plates from the upper and lower sides, to form the structure illustrated in FIG. 13. The structure was put in a furnace in a state of being sandwiched between the plates, and a weight was mounted on the upper surface of the plate to add weight to the connection portion.

The structure was heated to 780° C. in an air atmosphere in a state in which the weight was mounted to perform the first heat treatment. Subsequently, the structure was cooled to around room temperature, oxygen gas was introduced into the furnace, the structure was heated to 500° C. in an oxygen atmosphere to perform the second heat treatment, and a connection structure for superconducting wires was formed.

When terminals were attached to both ends of the connected superconducting wire to measure the temperature dependence of the electric resistance, a clear superconducting transition was confirmed at around 93 K. Relative electric resistance values in Examples and Comparative Examples are shown below with the electric resistance value of this connection structure after the superconducting transition set as a reference value 1.0.

The connection structure in Example 1 maintained connectivity equivalent to that at room temperature even when the temperature was lowered to 80 K and had connection strength to withstand heat shrinkage from room temperature to 80 K. Relative strength values in Examples and Comparative Examples are shown below with the tensile load applied to both ends of the connection structure in Example 1 when the connection portion was stripped away set as a reference value 1.0.

When the cross section of the connection portion was observed by means of SEM and SEM-EDX, the first crystal grains each formed in a plate shape or flat shape and having a composition of $GdBa_2Cu_3O_\delta$ ($6 \le \delta \le 7$) and the second crystal grains each formed in an irregular shape and having a composition of $GdBa_2Cu_3O_\delta$ ($6 \le \delta \le 7$) were found. The grain size of the first crystal grains (first grain size) was about 5 μm while the grain size of the second crystal grains (second grain size) was about 90 nm, and the size distribution was a bimodal.

In the connection portion, $Gd_2O_3$, $BaCO_3$, CuO, and a compound of Gd, Cu, and O were present. In addition, a small amount of Na was also found.

Example 2

Three oxide superconducting wires were prepared in which an intermediate layer and a $GdBa_2Cu_3O_{7-\delta}$ layer (oxide superconducting layer) were formed on a Hastelloy substrate and were covered with a protective layer of silver and copper. The length of one wire was 2 cm, and the length of each of the two remaining wires was 10 cm. A portion between both ends of the 2-cm wire and a 1-cm portion from one end of each of the two 10-cm wires were wet-etched with use of a mixed solution of nitric acid, ammonia, and hydrogen peroxide to expose the oxide superconducting layers.

An oxide superconductor formed by means of the MOD method and having a composition of $GdBa_2Cu_3O_\delta$ ($6 \le \delta \le 7$) was pulverized to prepare a superconductor powder having a median of the grain size (grain size) of about 50 nm.

The obtained superconductor powder, a $Gd_2O_3$ powder having a grain size of about 50 nm, a $BaCO_3$ powder having a grain size of about 70 nm, and a CuO powder having a grain size of about 30 nm were mixed in a bead mill using zirconia beads. The obtained mixed powder was supplied with water and sodium alginate to prepare slurry.

After the obtained slurry was applied to the exposed oxide superconducting layer of the aforementioned 2-cm superconducting wire, the portion of the 2-cm superconducting wire to which the slurry was applied and the portions of the 10-cm superconducting wires in which the superconducting layers were exposed were opposed, superposed, and sandwiched between plates from the upper and lower sides, to form the structure illustrated in FIG. 13. The structure was screwed shut in a state of being sandwiched between the plates so that weight was added to the connection portion and was put in a furnace in this state.

The structure was heated to 750° C. in a mixed atmosphere of nitrogen and oxygen to perform the first heat treatment. The oxygen concentration was set to 20%. Subsequently, the structure was cooled to around room temperature and was heated to 550° C. in an air atmosphere to perform the second heat treatment, and a connection structure for superconducting wires was formed.

When terminals were attached to both ends of the connected superconducting wire to measure the temperature dependence of the electric resistance, a clear superconducting transition was confirmed at around 93 K, and the relative electric resistance value was 1.0.

The connection structure in Example 2 maintained connectivity equivalent to that at room temperature even when the temperature was lowered to 80 K and had connection strength to withstand heat shrinkage from room temperature to 80 K. The relative connection strength was 1.0.

When the cross section of the connection portion was observed by means of SEM and SEM-EDX, the first crystal grains each formed in a plate shape or flat shape and having a composition of $GdBa_2Cu_3O_{7-\delta}$ and the second crystal grains each formed in an irregular shape and having a composition of $GdBa_2Cu_3O_{7-\delta}$ were found. Each of the grain sizes of the first crystal grains and the second crystal grains was about 100 nm, and no bimodal distribution was confirmed.

In the connection portion, $Gd_2O_3$, $BaCO_3$, CuO, and a compound of Gd, Cu, and O were present. In addition, a small amount of Na was also found.

Example 3

Three oxide superconducting wires were prepared in which an intermediate layer and a $GdBa_2Cu_3O_\delta$ ($6 \le \delta \le 7$) layer (oxide superconducting layer) were formed on a Hastelloy substrate and were covered with a protective layer of silver and copper. The length of one wire was 3 cm, and the length of each of the two remaining wires was 10 cm. Both ends of the 3-cm wire and 1-cm portions from ends of the two 10-cm wires were wet-etched with use of a mixed solution of nitric acid, ammonia, and hydrogen peroxide to expose the oxide superconducting layers.

Powders of $Gd_2O_3$, $BaCO_3$, and CuO were prepared, weighed appropriately, and mixed sufficiently, and the mixed powder was compression-molded to prepare a green compact. The obtained green compact was sintered at 930° C. to prepare an oxide superconductor having a composition of $GdBa_2Cu_3O_{7-\delta}$. The obtained oxide superconductor was pulverized to prepare a superconductor powder having a median of the grain size (grain size) of about 3 μm.

The obtained superconductor powder, a $Gd_2O_3$ powder having a grain size of about 50 cm, a $BaCO_3$ powder having a grain size of about 70 nm, and a CuO powder having a grain size of about 30 nm were mixed in a bead mill using zirconia beads. The obtained mixed powder was supplied with water and sodium alginate to prepare slurry.

After the obtained slurry was applied to the exposed oxide superconducting layer of the aforementioned. 3-cm superconducting wire, the portion of the 3-cm superconducting wire to which the slurry was applied and the portions of the 10-cm superconducting wires in which the superconducting layers were exposed were opposed, superposed, and sandwiched between plates from the upper and lower sides, to form the structure illustrated in FIG. 15. The structure was screwed shut in a state of being sandwiched between the plates so that weight was added to the connection portion and was put in a furnace in this state.

The structure was heated to 750° C. in a mixed atmosphere of nitrogen and oxygen to perform the first heat treatment. The oxygen concentration was set to 20%. Subsequently, the structure was cooled to around room temperature and was heated to 550° C. in an air atmosphere to perform the second heat treatment, and a connection structure for superconducting wires was formed.

When terminals were attached to both ends of the connected superconducting wire to measure the temperature dependence of the electric resistance, a clear superconducting transition was confirmed at around 93 K, and the relative electric resistance value was 0.5.

The connection structure in Example 3 maintained connectivity equivalent to that at room temperature even when the temperature was lowered to 80 K and had connection strength to withstand heat shrinkage from room temperature to 80 K. The relative connection strength was 0.8.

When the cross section of the connection portion was observed by means of SEM and SEM-EDX, the first crystal grains each formed in a plate shape or flat shape and having a composition of $GdBa_2Cu_3O_{7-\delta}$ and the second crystal grains each formed in an irregular shape and having a composition of $GdBa_2Cu_3O_{7-\delta}$ were found. The grain size of the first crystal grains was about 3 μm while the grain size of the second crystal grains was about 80 nm, and the grain size distribution was a bimodal distribution.

In the connection portion, a small amount of Na was found at the connection part, but $Gd_2O_3$, $BaCO_3$, CuO, and a compound of Gd, Cu, and O were not found.

Example 4

Three oxide superconducting wires were prepared in which an intermediate layer and a $GdBa_2Cu_3O_{7-\delta}$ layer (oxide superconducting layer) were formed on a Hastelloy substrate and were covered with a protective layer of silver and copper. The length of one wire was 3 cm, and the length of each of the two remaining wires was 10 cm. Both ends of the 3-cm wire and 1-cm portions from ends of the two 10-cm wires were wet-etched with use of a mixed solution of nitric acid, ammonia, and hydrogen peroxide to expose the oxide superconducting layers.

Powders of $Gd_2O_3$, $BaCO_3$, and CuO were prepared, weighed appropriately, and mixed sufficiently, and the mixed powder was compression-molded to prepare a green compact. The obtained green compact was sintered at 930° C. to prepare an oxide superconductor having a composition of $GdBa_2Cu_3O_\delta$ ($6\leq\delta\leq7$). The obtained oxide superconductor was pulverized to prepare a superconductor powder having a median of the grain size (grain size) of about 5 μm.

The obtained superconductor powder, a $Gd_2O_3$ powder having a grain size of about 50 nm, a $BaCO_3$ powder having a grain size of about 800 nm, and a CuO powder having a grain size of about 30 nm were mixed using a mortar. The obtained mixed powder was supplied with water and sodium alginate to prepare slurry.

After the obtained slurry was applied to the exposed oxide superconducting layer of the aforementioned 3-cm superconducting wire, the portion of the 3-cm superconducting wire to which the slurry was applied and the portions of the 10-cm superconducting wires in which the superconducting layers were exposed were opposed, superposed, and sandwiched between plates from the upper and lower sides, to form the structure illustrated in FIG. 15. The structure was screwed shut in a state of being sandwiched between the plates so that weight was added to the connection portion and was put in a furnace in this state.

The structure was heated to 800° C. in an Ar atmosphere to perform the first heat treatment. Subsequently, the structure was cooled to 500° C., oxygen gas was introduced into the furnace, the temperature was maintained at 500° C. in an oxygen atmosphere to perform the second heat treatment, and a connection structure for superconducting wires was formed.

When terminals were attached to both ends of the connected superconducting wire to measure the temperature dependence of the electric resistance, a clear superconducting transition was confirmed at around 93 K, and the relative electric resistance value was 0.8. Also, this connection structure maintained connectivity equivalent to that at room temperature even when the temperature was lowered to 80 K and had connection strength to withstand heat shrinkage from room temperature to 80 K. The relative connection strength was 0.7.

When the cross section of the connection portion was observed by means of SEM and SEM-EDX, the first crystal grains each formed in a plate shape or flat shape and having a composition of $GdBa_2Cu_3O_{7-\delta}$ and the second crystal grains each formed in an irregular shape and having a composition of $GdBa_2Cu_3O_\delta$ ($6\leq\delta\leq7$) were found. The grain size of the first crystal grains (first grain size) was about 7 μm while the grain size of the second crystal grains (second grain size) was about 5 μm, and a clear bimodal distribution was not confirmed.

In the connection portion, $Gd_2O_3$, $BaCO_3$, CuO, and a compound of Gd, Cu, and O were present. In addition, a small amount of Na was also found.

Example 5

A connection structure was formed, measured, and observed in a similar manner to that in Example 1 except that a superconductor powder having a median of the grain size (grain size) of about 10 μm was prepared.

Example 6

A connection structure was formed, measured, and observed in a similar manner to that in Example 2 except that the first heat treatment temperature was set to 740° C.

Example 7

A connection structure was formed, measured, and observed in a similar manner to that in Example 1 except that a superconductor powder having a median of the grain size (grain size) of about 12 µm was prepared.

Example 8

A connection structure was formed, measured, and observed in a similar manner to that in Example 1 except that a superconductor powder having a median of the grain size (grain size) of about 700 nm was prepared.

Example 9

A connection structure was formed, measured, and observed in a similar manner to that in Example 1 except that a superconductor powder having a median of the grain size (grain size) of about 1 µm was prepared and that the superconductor powder was agitated with a stirrer to make the grain shape irregular.

Example 10

A connection structure was formed, measured, and observed in a similar manner to that in Example 1 except that sodium alginate was not used.

Example 11

A connection structure was formed, measured, and observed in a similar manner to that in Example 1 except that the ratio of the mixing amount of the superconductor powder is reduced to the amount of a $Gd_2O_3$ powder having a grain size of about 50 nm, a $BaCO3$ powder having a grain size of about 70 nm, and a CuO powder having a grain size of about 30 nm.

Example 12

A connection structure was formed, measured, and observed in a similar manner to that in Example 1 except that the ratio of the mixing amount of the superconductor powder is reduced to the amount of a $Gd_2O_3$ powder having a grain size of about 50 nm, a $BaCO_3$ powder having a grain size of about 70 nm, and a CuO powder having a grain size of about 30 nm.

Example 13

A connection structure was formed, measured, and observed in a similar manner to that in Example 1 except that Gd (gadolinium) was replaced Y (yttrium) and that the first heat treatment temperature was set to 800° C.

Example 14

A connection structure was formed, measured, and observed in a similar manner to that in Example 1 except that Gd (gadolinium) was replaced with Eu (erbium).

Comparative Example 1

Three oxide superconducting wires were prepared in which an intermediate layer and a $GdBa_2Cu_3O_\delta$ (6≤δ≤7) layer (oxide superconducting layer) were formed on a Hastelloy substrate and were covered with a protective layer of silver and copper. The length of one wire was 2 cm, and the length of each of the two remaining wires was 10 cm. A portion between both ends of the 2-cm wire and a 1-cm portion from one end of each of the two 10-cm wires were wet-etched with use of a mixed solution of nitric acid, ammonia, and hydrogen peroxide to expose the oxide superconducting layers.

Powders of $Gd_2O_3$, $BaCO_3$, and CuO were prepared, weighed appropriately, and mixed sufficiently, and the mixed powder was compression-molded to prepare a green compact. The obtained green compact was sintered at 930° C. to prepare an oxide superconductor having a composition of $GdBa_2Cu_3O_\delta$ (6≤δ≤7). The obtained oxide superconductor was pulverized to prepare a superconductor powder having a median of the grain size (grain size) of about 3 µm.

After the obtained superconductor powder was supplied with water and sodium alginate to form slurry, and the slurry was applied to the exposed oxide superconducting layer of the aforementioned 2-cm superconducting wire, the portion of the 2-cm superconducting wire to which the slurry was applied and the portions of the 10-cm superconducting wires in which the superconducting layers were exposed were opposed, superposed, and sandwiched between plates from the upper and lower sides, to form a similar structure to the structure illustrated in FIG. 13. The structure was put in a furnace in a state of being sandwiched between the plates, and a weight was mounted on the upper surface of the plate to add weight to the connection portion.

The structure was heated to 950° C. in an air atmosphere in a state in which the weight was mounted to perform the first heat treatment. Subsequently, the structure was cooled to around room temperature, oxygen gas was introduced to the furnace, the structure was heated to 500° C. in an oxygen atmosphere to perform the second heat treatment, and a connection structure for superconducting wires was formed.

When terminals were attached to both ends of the connected superconducting wire to measure the temperature dependence of the electric resistance, a clear superconducting transition was not confirmed, and a high resistance value was derived.

The connection structure in Comparative Example 1 maintained connectivity equivalent to that at room temperature even when the temperature was lowered to 80 K and had connect ion strength to withstand heat shrinkage from room temperature to 80 K. The relative connection strength was 2.

When the cross section of the connection portion was observed by means of SEM and SEM-EDX, the first crystal grains each formed in a plate shape or flat shape, having a composition of $GdBa_2Cu_3O_{7-\delta}$, and having a grain size of about 3 µm and a small amount of Na were found.

Comparative Example 2

Three oxide superconducting wires were prepared in which an intermediate layer and a $GdBa_2Cu_3O_\delta$ (6≤δ≤7) layer (oxide superconducting layer) were formed on a Hastelloy substrate and were covered with a protective layer of silver and copper. The length of one wire was 2 cm, and the length of each of the two remaining wires was 10 cm. A portion between both ends of the 2-cm wire and a 1-cm portion from one end of each of the two 10-cm wires were wet-etched with use of a mixed solution of nitric acid, ammonia, and hydrogen peroxide co expose the oxide superconducting layers.

A $Gd_2O_3$ powder having a grain size of about 50 nm, a $BaCO_3$ powder having a grain size of about 70 nm, and a CuO powder having a grain size of about 30 nm were mixed using a mortar. The obtained mixed powder was supplied with water and sodium alginate to prepare slurry.

After the obtained slurry was applied to the exposed oxide superconducting layer of the aforementioned 2-cm superconducting wire, the portion of the 2-cm superconducting wire to which the slurry was applied and the portions of the 10-cm superconducting wires in which the superconducting layers were exposed were opposed, superposed, and sandwiched between plates from the upper and lower sides, to form a similar structure to the structure illustrated in FIG. 13. The structure was put in a furnace in a state of being sandwiched between the plates, and a weight was mounted on the upper surface of the plate to add weight to the connection portion.

The structure was heated to 780° C. in an air atmosphere in a state in which the weight was mounted to perform the first heat treatment. Subsequently, the structure was cooled to around room temperature, oxygen gas was introduced into the furnace, the structure was heated to 500° C. in an oxygen atmosphere to perform the second heat treatment, and a connection structure for superconducting wires was formed.

When terminals were attached to both ends of the connected superconducting wire to measure the temperature dependence of the electric resistance, a clear superconducting transition was not confirmed, and a high resistance value was derived.

The connection structure in Comparative Example 2 maintained connectivity equivalent to that at room temperature even when the temperature was lowered to 80 K and had connection strength to withstand heat shrinkage from room temperature to 80 K. The relative connection strength was 1.

When the cross section of the connection portion was observed by means of SEM and SEM-EDX, the first crystal grains each formed in an irregular shape, having a composition of $GdBa_2Cu_3O_{7-\delta}$, and having a grain size of about 100 nm were found. In the connection portion, $Gd_2O_3$, $BaCO_3$, CuO, and a compound of Gd, Cu, and O were present. In addition, a small amount of Na was also found.

Comparative Example 3

Three oxide superconducting wires were prepared in which an intermediate layer and a $GdBa_2Cu_3O_\delta$ ($6 \leq \delta \leq 7$) layer (oxide superconducting layer) were formed on a Hastelloy substrate and were covered with a protective layer of silver and copper. The length of one wire was 2 cm, and the length of each of the two remaining wires was 10 cm. A portion between both ends of the 2-cm wire and a 1-cm portion from one end of each of the two 10-cm wires were wet-etched with use of a mixed solution of nitric acid, ammonia, and hydrogen peroxide to expose the oxide superconducting layers.

Powders of $Gd_2O_3$, $BaCO_3$, and CuO were prepared, weighed appropriately, and mixed sufficiently, and the mixed powder was compression-molded to prepare a green compact. The obtained green compact was sintered at 930° C. to prepare an oxide superconductor having a composition of $GdBa_2Cu_3O_{7\delta}$. The obtained oxide superconductor was pulverized to prepare a superconductor powder having a median of the grain size (grain size) of about 3 μm.

After the obtained superconductor powder was supplied with water and sodium alginate to form slurry, and the slurry was applied to the exposed oxide superconducting layer of the aforementioned 2-cm superconducting wire, the portion of the 2-cm superconducting wire to which the slurry was applied and the portions of the 10-cm superconducting wires in which the superconducting layers were exposed were opposed, superposed, and sandwiched between plates from the upper and lower sides, to form the structure illustrated in FIG. 13. The structure was put in a furnace in a state of being sandwiched between the plates, and a weight was mounted on the upper surface of the plate to add weight to the connection portion.

The structure was heated to 800° C. in an air atmosphere in a state in which the weight was mounted to perform the first heat treatment. Subsequently, the structure was cooled to around room temperature, oxygen gas was introduced into the furnace, the structure was heated to 500° C. in an oxygen atmosphere to perform the second heat treatment, and a connection structure for superconducting wires was formed.

The sample in Comparative Example 3 was stripped away immediately after being taken out of the furnace and did not form a connection structure.

Table 1 illustrates evaluation results of the samples obtained in Examples 1 to 14 and Comparative Examples 1 to 3.

| | RE—Ba—Cu—O FIRST GRAIN SIZE | RE—Ba—Cu—O SECOND GRAIN SIZE | FIRST GRAIN SIZE/ SECOND GRAIN SIZE | RE—Ba—Cu—O GRAIN SHAPE CORRESPONDING TO FIRST GRAIN SIZE DISTRIBUTION | RE—Ba—Cu—O RATIO OF NUMBER OF GRAINS OF EQUAL TO OR MORE THAN 100 nm AND EQUAL TO OR LESS THAN 10 μm | FIRST GRAIN | SECOND GRAIN |
|---|---|---|---|---|---|---|---|
| EXAMPLE 1 | 5 μm | 90 nm | 56 | PLATE/FLAT SHAPE | 50% | Gd2O3 | BaCO3 |
| EXAMPLE 2 | 100 nm | 100 nm | 1.0 | PLATE/FLAT SHAPE | 40% | Gd2O3 | BaCO3 |
| EXAMPLE 3 | 3 μm | 80 nm | 38 | PLATE/FLAT SHAPE | 45% | NONE | NONE |
| EXAMPLE 4 | 7 μm | 5 μm | 1.4 | PLATE/FLAT SHAPE | 95% | Gd2O3 | BaCO3 |
| EXAMPLE 5 | 10 μm | 90 nm | 111 | PLATE/FLAT SHAPE | 50% | Gd2O3 | BaCO3 |
| EXAMPLE 6 | 90 nm | 90 nm | 1.0 | PLATE/FLAT SHAPE | 10% | Gd2O3 | BaCO3 |
| EXAMPLE 7 | 12 μm | 90 nm | 133 | PLATE/FLAT SHAPE | 48% | Gd2O3 | BaCO3 |

-continued

| | | | | | | | |
|---|---|---|---|---|---|---|---|
| EXAMPLE 8 | 900 nm | 90 nm | 10 | PLATE/FLAT SHAPE | 30% | Gd2O3 | BaCO3 |
| EXAMPLE 9 | 900 nm | 90 nm | 10 | IRREGULAR SHAPE | 32% | Gd2O3 | BaCO3 |
| EXAMPLE 10 | 5 μm | 90 nm | 56 | PLATE/FLAT SHAPE | 40% | Gd2O3 | BaCO3 |
| EXAMPLE 11 | 5 μm | 90 nm | 56 | PLATE/FLAT SHAPE | 1% | Gd2O3 | BaCO3 |
| EXAMPLE 12 | 5 μm | 90 nm | 56 | PLATE/FLAT SHAPE | 0.50% | Gd2O3 | BaCO3 |
| EXAMPLE 13 | 3 μm | 200 nm | 15 | PLATE/FLAT SHAPE | 60% | Y2O3 | BaCO3 |
| EXAMPLE 14 | 3 μm | 80 nm | 38 | PLATE/FLAT SHAPE | 50% | Eu2O3 | BaCO3 |
| COMPARATIVE EXAMPLE 1 | 3 μm | N/A | N/A | PLATE/FLAT SHAPE | N/A | NONE | NONE |
| COMPARATIVE EXAMPLE 2 | 100 nm | N/A | N/A | IRREGULAR SHAPE | N/A | Gd2O3 | BaCO3 |
| COMPARATIVE EXAMPLE 3 | 3 μm | N/A | N/A | PLATE/FLAT SHAPE | N/A | NONE | NONE |

| | THIRD GRAIN | FOURTH GRAIN | Na | SUPERCONDUCTING TRANSITION | RELATIVE ELECTRIC RESISTANCE VALUE | RELATIVE CONNECTION STRENGTH |
|---|---|---|---|---|---|---|
| EXAMPLE 1 | CuO | Gd—Cu—O | CONTAINED | CONFIRMED | 1.0 | 1.0 |
| EXAMPLE 2 | CuO | Gd—Cu—O | CONTAINED | CONFIRMED | 1.0 | 1.0 |
| EXAMPLE 3 | NONE | NONE | CONTAINED | CONFIRMED | 0.5 | 0.8 |
| EXAMPLE 4 | CuO | Gd—Cu—O | CONTAINED | CONFIRMED | 0.8 | 0.7 |
| EXAMPLE 5 | CuO | Gd—Cu—O | CONTAINED | CONFIRMED | 1.0 | 1.0 |
| EXAMPLE 6 | CuO | Gd—Cu—O | CONTAINED | CONFIRMED | 3.0 | 1.0 |
| EXAMPLE 7 | CuO | Gd—Cu—O | CONTAINED | CONFIRMED | 0.9 | 0.9 |
| EXAMPLE 8 | CuO | Gd—Cu—O | CONTAINED | CONFIRMED | 1.0 | 1.0 |
| EXAMPLE 9 | CuO | Gd—Cu—O | CONTAINED | CONFIRMED | 5.0 | 1.0 |
| EXAMPLE 10 | CuO | Gd—Cu—O | NOT CONTAINED | CONFIRMED | 1.1 | 0.9 |
| EXAMPLE 11 | CuO | Gd—Cu—O | CONTAINED | CONFIRMED | 1.2 | 1.0 |
| EXAMPLE 12 | CuO | Gd—Cu—O | CONTAINED | CONFIRMED | 5.0 | 1.0 |
| EXAMPLE 13 | CuO | Y—Cu—O | CONTAINED | CONFIRMED | 0.8 | 0.8 |
| EXAMPLE 14 | CuO | Eu—Cu—O | CONTAINED | CONFIRMED | 1 | 1.0 |
| COMPARATIVE EXAMPLE 1 | NONE | NONE | CONTAINED | NOT CONFIRMED | N/A | 2.0 |
| COMPARATIVE EXAMPLE 2 | CuO | Gd—Cu—O | CONTAINED | NOT CONFIRMED | N/A | 1.0 |
| COMPARATIVE EXAMPLE 3 | NONE | NONE | CONTAINED | NOT CONFIRMED | N/A | 0 |

It is apparent from Table 1 that each of Examples 1, 3, 5, and 7 to 14, which is a connection structure for a superconducting layer including a first superconducting layer, a second superconducting layer, and a connection layer provided between the first superconducting layer and the second superconducting layer, the connection layer including a crystal grain containing a rare earth element (RE), barium (Ba), copper (Cu), and oxygen (O), the crystal grain having a grain size distribution including a bimodal distribution, has lower electric resistance than each of Comparative Examples 1 to 3, which includes no bimodal distribution.

It is also apparent from Table 1 that, among Examples 1, 3, 5, and 7 to 14, each of Examples 1, 5, 8, 11, and 14, which satisfies items that (1) a first grain size is equal to or more than 100 nm and equal to or less than 10 μm, (2) the first grain size is equal to or more than 10 times the second grain size, (3) a grain shape corresponding to a first distribution is a plate shape or flat shape, (4) the ratio of crystal grains having a grain size of equal to or more than 100 nm and equal to or less than 10 μm is equal to or more than 1% and equal to or less than 50% in terms of number, (5) at as any one grain selected from the group including a first grain, a second grain, a third grain, and a fourth grain is included, and (6) sodium is contained, has lower electric resistance or higher mechanical strength than each of Examples 3, 7, 9, 10, 12, and 13, which does not satisfy at least one out of the above items (1) to (6).

It is also apparent from Table 1 that each of Examples 2, 4, and 6, which is a connection structure for a superconducting layer including a first superconducting layer, a second superconducting layer, and a connection layer provided between the first superconducting layer and the second superconducting layer, the connection layer including a crystal grain containing a rare earth element (RE), barium (Ba), copper (Cu), and oxygen (O) and at least one grain selected from the group including a first grain containing a rare earth element (RE) and oxygen (O), a second grain containing barium (Ba), carbon (C), and oxygen (O), a third grain containing copper (Cu) and oxygen (O), and a fourth grain containing barium (Ba), copper (Cu), and oxygen (O), has lower electric resistance than each of Comparative Examples 1 and 3, which does not include the first grain, the second grain, the third grain, and the fourth grain.

While certain embodiments have been described, these embodiments have been presented by way of example only, and are not intended to limit the scope of the inventions. Indeed, a connection structure for a superconducting layer, a superconducting wire, a superconducting coil, a superconducting device, and a connection method for a superconducting layer described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and sprit of the inventions.

What is claimed is:

1. A connection structure for a superconducting layer comprising:
a first superconducting layer;
a second superconducting layer; and
a connection layer disposed between the first superconducting layer and the second superconducting layer, the connection layer including crystal grains containing a rare earth element (RE), barium (Ba), copper (Cu), and oxygen (O), the crystal grains having a grain size distribution including a bimodal distribution,
wherein the bimodal distribution includes a first distribution including a first peak and a second distribution including a second peak,
wherein a first grain size corresponding to the first peak is larger than a second grain size corresponding to the second peak, and
wherein, among the crystal grains, crystal grains having a grain size corresponding to the first distribution include a crystal grain having a plate shape or a flat shape.

2. The connection structure according to claim 1, wherein the first grain size is equal to or more than 100 nm and equal to or less than 10 μm.

3. The connection structure according to claim 1, wherein the first grain size is equal to or more than 10 times the second grain size.

4. The connection structure according to claim 1, wherein, among the crystal grains, a ratio of crystal grains having a grain size of equal to or more than 100 nm and equal to or less than 10 μm is equal to or more than 1% and equal to or less than 50% in terms of number.

5. The connection structure according to claim 1, wherein the connection layer includes at least one grain selected from the group consisting of a first grain containing a rare earth element (RE) and oxygen (O), a second grain containing barium (Ba), carbon (C), and oxygen (O), a third grain containing copper (Cu) and oxygen (O), and a fourth grain containing barium (Ba), copper (Cu), and oxygen (O).

6. The connection structure according to claim 1, wherein the connection layer contains sodium (Na).

7. A connection structure for a superconducting layer comprising:
a first superconducting layer;
a second superconducting layer; and
a connection layer disposed between the first superconducting layer and the second superconducting layer, the connection layer including crystal grains containing a rare earth element (RE), barium (Ba), copper (Cu), and oxygen (O) and at least one grain selected from the group consisting of a first grain containing a rare earth element (RE) and oxygen (O), a second grain containing barium (Ba), carbon (C), and oxygen (O), a third grain containing copper (Cu) and oxygen (O), and a fourth grain containing barium (Ba), copper (Cu), and oxygen (O),
wherein the crystal grains include a crystal grain having a plate shape or a flat shape.

8. A superconducting wire comprising:
a first superconducting wire including a first superconducting layer;
a second superconducting wire including a second superconducting layer;
a third superconducting layer including a first surface and a second surface opposed to the first surface; and
a connection layer disposed between the first superconducting layer and the third superconducting layer and between the second superconducting layer and the third superconducting layer and including crystal grains containing a rare earth element (RE), barium (Ba), copper (Cu), and oxygen (O), the crystal grains having a grain size distribution including a bimodal distribution,
wherein the first superconducting layer and the second superconducting layer face the first surface of the third superconducting layer,
wherein the bimodal distribution includes a first distribution including a first peak and a second distribution including a second peak,
wherein a first grain size corresponding to the first peak is larger than a second grain size corresponding to the second peak, and
wherein, among the crystal grains, crystal grains having a grain size corresponding to the first distribution include a crystal grain having a plate shape or a flat shape.

9. The superconducting wire according to claim 8, wherein the first grain size is equal to or more than 100 nm and equal to or less than 10 μm.

10. The superconducting wire according to claim 8, wherein the first grain size is equal to or more than 10 times the second grain size.

11. A superconducting wire comprising:
a first superconducting wire including a first superconducting layer;
a second superconducting wire including a second superconducting layer;
a third superconducting layer including a first surface and a second surface opposed to the first surface; and
a connection layer disposed between the first superconducting layer and the third superconducting layer and between the second superconducting layer and the third superconducting layer, the connection layer including crystal grains containing a rare earth element (RE), barium (Ba), copper (Cu), and oxygen (O), and the connection layer including at least one grain selected from the group consisting of a first grain containing a rare earth element (RE) and oxygen (O), a second grain containing barium (Ba), carbon (C), and oxygen (O), a third grain containing copper (Cu) and oxygen (O), and a fourth grain containing barium (Ba), copper (Cu), and oxygen (O),
wherein the first superconducting layer and the second superconducting layer face the first surface of the third superconducting layer, and
wherein the crystal grains includes a crystal grain having a plate shape or a flat shape.

12. The superconducting wire according to claim 8, wherein the connection layer does not exist between the first superconducting wire and the second superconducting wire.

13. The superconducting wire according to claim 8, wherein the connection layer between the first superconducting layer and the third superconducting layer and the connection layer between the second superconducting layer and the third superconducting layer are continuous.

14. The superconducting wire according to claim 8, further comprising:
a first protective layer in contact with a part of the first superconducting layer; and
a second protective layer in contact with a part of the second superconducting layer, wherein the third superconducting layer has an absence of a protective layer.

15. A superconducting coil comprising the superconducting wire according to claim 8.

16. A superconducting device comprising the superconducting coil according to claim 15.

17. The connection structure according to claim 1, wherein the crystal grain having the plate shape or the flat shape is a superconductor.

18. The connection structure according to claim 1, wherein the crystal grain having the plate shape or the flat shape has a chemical composition represented as (RE)Ba$_2$Cu$_3$O$_\delta$ (RE is a rare earth element, $6 \leq \delta \leq 7$).

19. A connection method for a superconducting layer comprising:
   preparing a first superconducting layer and a second superconducting layer;
   preparing slurry including a crystal grain containing a rare earth element (RE), barium (Ba), copper (Cu), and oxygen (O), a first grain containing a rare earth element (RE) and oxygen (O), a second grain containing barium (Ba), carbon (C), and oxygen (O), and a third grain containing copper (Cu) and oxygen (O);
   applying the slurry onto the second superconducting layer;
   superposing the first superconducting layer and the second superconducting layer with the slurry interposed between the first superconducting layer and the second superconducting layer;
   performing a first heat treatment at a first temperature; and
   performing a second heat treatment at a second temperature in an atmosphere having oxygen partial pressure equal to or higher than oxygen partial pressure in the first heat treatment.

20. The method according to claim 19, wherein the first temperature is equal to or less than 800° C.

* * * * *